US012072376B2

(12) United States Patent
Fayneh et al.

(10) Patent No.: US 12,072,376 B2
(45) Date of Patent: Aug. 27, 2024

(54) DIE-TO-DIE CONNECTIVITY MONITORING

(71) Applicant: proteanTecs Ltd., Haifa (IL)

(72) Inventors: Eyal Fayneh, Givatayim (IL); Guy Redler, Haifa (IL); Evelyn Landman, Haifa (IL); Ishai Zeev Cohen, Haifa (IL); Shaked Rahamim, Geva Carmel (IL); Alex Khazin, Nesher (IL)

(73) Assignee: PROTEANTECS LTD., Haifa (IL)

( * ) Notice: Subject to any disclaimer, the term of this patent is extended or adjusted under 35 U.S.C. 154(b) by 312 days.

(21) Appl. No.: 17/712,698

(22) Filed: Apr. 4, 2022

(65) Prior Publication Data

US 2022/0229107 A1 Jul. 21, 2022

Related U.S. Application Data

(63) Continuation of application No. 17/205,780, filed on Mar. 18, 2021, now Pat. No. 11,293,977, which is a
(Continued)

(51) Int. Cl.
*G01R 31/30* (2006.01)
*G01R 31/3173* (2006.01)
(Continued)

(52) U.S. Cl.
CPC ..... *G01R 31/3016* (2013.01); *G01R 31/3173* (2013.01); *H01L 23/5386* (2013.01); *H03K 19/00323* (2013.01)

(58) Field of Classification Search
None
See application file for complete search history.

(56) References Cited

U.S. PATENT DOCUMENTS 4,555,663 A 11/1985 Shimizu
5,548,539 A 8/1996 Vlach et al.
(Continued)

FOREIGN PATENT DOCUMENTS

CN 101014991 A 8/2007
CN 101344898 A 1/2009
(Continued)

OTHER PUBLICATIONS

Translation of JP-2010161692-A (Year: 2012).*
(Continued)

*Primary Examiner* — Jermele M Hollington
(74) *Attorney, Agent, or Firm* — The Roy Gross Law Firm, LLC; Roy Gross

(57) ABSTRACT

An input/output (I/O) sensor for a multi-IC module. The I/O sensor includes: delay circuitry, configured to receive a data signal from an interconnected part of an IC of the multi-IC module and to generate a delayed data signal, the delay circuitry including an adjustable delay-line configured to delay an input signal by a set time duration; a comparison circuit, configured to generate a comparison signal by comparing the data signal with the delayed data signal; and processing logic, configured to set the time duration of the adjustable delay-line and, based on the comparison signal, identify a margin measurement of the data signal for determining an interconnect quality parameter.

18 Claims, 12 Drawing Sheets

Related U.S. Application Data continuation of application No. PCT/IB2021/051725, filed on Mar. 2, 2021.

(60) Provisional application No. 63/012,457, filed on Apr. 20, 2020.

(51) Int. Cl.
*H01L 23/538* (2006.01)
*H03K 19/003* (2006.01)

(56) References Cited

U.S. PATENT DOCUMENTS

| | | | |
|---|---|---|---|
| 5,748,509 | A | 5/1998 | Fewster |
| 5,774,403 | A | 6/1998 | Clark, II et al. |
| 5,818,251 | A | 10/1998 | Intrater |
| 5,895,629 | A | 4/1999 | Russell et al. |
| 5,956,497 | A | 9/1999 | Ratzel et al. |
| 5,966,527 | A | 10/1999 | Krivokapic et al. |
| 6,172,546 | B1 | 1/2001 | Liu et al. |
| 6,182,253 | B1 | 1/2001 | Lawrence et al. |
| 6,586,921 | B1 | 7/2003 | Sunter |
| 6,683,484 | B1 | 1/2004 | Kueng et al. |
| 6,807,503 | B2 | 10/2004 | Ye et al. |
| 6,873,926 | B1 | 3/2005 | Diab |
| 6,882,172 | B1 | 4/2005 | Suzuki et al. |
| 6,948,388 | B1 | 9/2005 | Clayton et al. |
| 7,038,483 | B1 | 5/2006 | Suzuki et al. |
| 7,067,335 | B2 | 6/2006 | Weiner et al. |
| 7,254,507 | B2 | 8/2007 | Dosho et al. |
| 7,369,893 | B2 | 5/2008 | Gunderson |
| 7,443,189 | B2 | 10/2008 | Ramappa |
| 7,455,450 | B2 | 11/2008 | Liu |
| 7,501,832 | B2 | 3/2009 | Spuhler et al. |
| 7,701,246 | B1 | 4/2010 | Plants |
| 7,818,601 | B2 | 10/2010 | LaBerge |
| 7,877,657 | B1 | 1/2011 | Miller et al. |
| 7,940,862 | B2 | 5/2011 | Tanaka et al. |
| 8,001,512 | B1 | 8/2011 | White |
| 8,086,978 | B2 | 12/2011 | Zhang et al. |
| 8,170,067 | B2 * | 5/2012 | Zerbe ............ G06F 12/0246 |
| | | | 713/400 |
| 8,310,265 | B2 | 11/2012 | Zjajo et al. |
| 8,365,115 | B2 | 1/2013 | Liu et al. |
| 8,418,103 | B2 | 4/2013 | Wang et al. |
| 8,479,130 | B1 | 7/2013 | Zhang et al. |
| 8,633,722 | B1 | 1/2014 | Lai |
| 8,825,158 | B2 | 9/2014 | Swerdlow |
| 8,996,937 | B2 | 3/2015 | Jain et al. |
| 9,275,706 | B2 | 3/2016 | Tam |
| 9,424,952 | B1 | 8/2016 | Seok et al. |
| 9,490,787 | B1 | 11/2016 | Kho et al. |
| 9,536,038 | B1 | 1/2017 | Quinton et al. |
| 9,564,883 | B1 | 2/2017 | Quinton et al. |
| 9,564,884 | B1 | 2/2017 | Quinton et al. |
| 9,632,126 | B2 | 4/2017 | Yoon et al. |
| 9,714,966 | B2 | 7/2017 | Chen et al. |
| 9,760,672 | B1 | 9/2017 | Taneja et al. |
| 9,791,834 | B1 | 10/2017 | Nassar |
| 9,954,455 | B2 | 4/2018 | Lin et al. |
| 9,991,879 | B2 | 6/2018 | Huang |
| 10,490,547 | B1 | 11/2019 | Ali et al. |
| 10,509,104 | B1 | 12/2019 | Dato |
| 10,530,347 | B2 | 1/2020 | Tang et al. |
| 10,740,262 | B2 | 8/2020 | Fayneh et al. |
| 11,081,193 | B1 | 8/2021 | Tang |
| 11,293,977 | B2 * | 4/2022 | Fayneh ............ H03K 19/00323 |
| 11,409,323 | B2 | 8/2022 | Herberholz et al. |
| 2004/0009616 | A1 | 1/2004 | Huisman et al. |
| 2004/0015793 | A1 | 1/2004 | Saxena |
| 2004/0230385 | A1 | 11/2004 | Bechhoefer et al. |
| 2004/0230396 | A1 | 11/2004 | Ye |
| 2005/0053162 | A1 | 3/2005 | Goishi |
| 2005/0104175 | A1 | 5/2005 | Itano et al. |
| 2005/0114056 | A1 | 5/2005 | Patel et al. |
| 2005/0134394 | A1 | 6/2005 | Liu |
| 2005/0154552 | A1 | 7/2005 | Stroud et al. |
| 2006/0049886 | A1 | 3/2006 | Agostinelli, Jr. et al. |
| 2006/0224374 | A1 | 10/2006 | Kwon et al. |
| 2007/0110199 | A1 | 5/2007 | Momtaz |
| 2007/0182456 | A1 | 8/2007 | Agarwal et al. |
| 2007/0288183 | A1 | 12/2007 | Bulkes et al. |
| 2008/0071489 | A1 | 3/2008 | Wissel |
| 2008/0074521 | A1 | 3/2008 | Olsen |
| 2008/0144243 | A1 | 6/2008 | Mariani et al. |
| 2008/0147355 | A1 | 6/2008 | Fields et al. |
| 2008/0183409 | A1 | 7/2008 | Roberts |
| 2008/0186001 | A1 | 8/2008 | Singh et al. |
| 2008/0186044 | A1 | 8/2008 | Singh |
| 2008/0231310 | A1 | 9/2008 | Vijayaraghavan et al. |
| 2008/0262769 | A1 | 10/2008 | Kadosh et al. |
| 2009/0027077 | A1 | 1/2009 | Vijayaraghavan et al. |
| 2009/0076753 | A1 | 3/2009 | Vijayaraghavan et al. |
| 2009/0096495 | A1 | 4/2009 | Keigo |
| 2009/0183043 | A1 | 7/2009 | Niwa |
| 2009/0222775 | A1 | 9/2009 | Idgunji et al. |
| 2009/0230947 | A1 | 9/2009 | Sumita |
| 2009/0244998 | A1 | 10/2009 | Kim |
| 2009/0273550 | A1 | 11/2009 | Vieri et al. |
| 2009/0278576 | A1 | 11/2009 | Chakravarty |
| 2009/0306953 | A1 | 12/2009 | Liu et al. |
| 2010/0153896 | A1 | 6/2010 | Sewall et al. |
| 2010/0251046 | A1 | 9/2010 | Mizuno et al. |
| 2010/0253382 | A1 | 10/2010 | Wang et al. |
| 2011/0093830 | A1 | 4/2011 | Chen et al. |
| 2011/0102091 | A1 | 5/2011 | Yeric |
| 2011/0109377 | A1 | 5/2011 | Fujibe et al. |
| 2011/0113298 | A1 | 5/2011 | Van Den Eijnden |
| 2011/0187433 | A1 | 8/2011 | Baumann et al. |
| 2011/0267096 | A1 | 11/2011 | Chlipala et al. |
| 2011/0295403 | A1 | 12/2011 | Higuchi et al. |
| 2011/0315986 | A1 | 12/2011 | Kaneda et al. |
| 2012/0025846 | A1 | 2/2012 | Minas et al. |
| 2012/0038388 | A1 | 2/2012 | Tseng et al. |
| 2012/0063524 | A1 | 3/2012 | Stott et al. |
| 2012/0074973 | A1 | 3/2012 | Baldwin et al. |
| 2012/0163074 | A1 | 6/2012 | Franca-Neto et al. |
| 2012/0187991 | A1 | 7/2012 | Sathe |
| 2012/0212246 | A1 | 8/2012 | Benjamin |
| 2012/0217976 | A1 | 8/2012 | Clarkson |
| 2012/0221906 | A1 | 8/2012 | Shetty et al. |
| 2012/0242490 | A1 | 9/2012 | Ramaswami |
| 2013/0088256 | A1 | 4/2013 | Chlipala et al. |
| 2013/0226491 | A1 | 8/2013 | Miguelanez, II et al. |
| 2013/0335875 | A1 | 12/2013 | Baumann |
| 2014/0132293 | A1 | 5/2014 | Abadir et al. |
| 2014/0132315 | A1 | 5/2014 | Sharma et al. |
| 2014/0143586 | A1 * | 5/2014 | Dalumi ............ G06F 1/14 |
| | | | 713/600 |
| 2014/0184243 | A1 | 7/2014 | Iyer et al. |
| 2014/0254734 | A1 | 9/2014 | Abdelmoneum |
| 2015/0061707 | A1 | 3/2015 | Balasubramanian et al. |
| 2015/0077136 | A1 | 3/2015 | Li |
| 2015/0121158 | A1 | 4/2015 | Wang et al. |
| 2015/0199223 | A1 | 7/2015 | Banerjee et al. |
| 2015/0332451 | A1 | 11/2015 | Amzaleg |
| 2015/0365049 | A1 | 12/2015 | Ozawa et al. |
| 2016/0033574 | A1 | 2/2016 | Serrer et al. |
| 2016/0042784 | A1 | 2/2016 | Rim et al. |
| 2016/0087643 | A1 | 3/2016 | Nozaki |
| 2016/0131708 | A1 | 5/2016 | Huang et al. |
| 2016/0153840 | A1 | 6/2016 | Huang et al. |
| 2016/0156176 | A1 | 6/2016 | Kunz, Jr. et al. |
| 2016/0164503 | A1 | 6/2016 | Kim et al. |
| 2016/0203036 | A1 | 7/2016 | Mezic et al. |
| 2016/0254804 | A1 | 9/2016 | Meng |
| 2017/0038265 | A1 | 2/2017 | Abdelmoneum et al. |
| 2017/0093399 | A1 | 3/2017 | Atkinson et al. |
| 2017/0160339 | A1 | 6/2017 | Jenkins |
| 2017/0179173 | A1 | 6/2017 | Mandai et al. |
| 2017/0199089 | A1 | 7/2017 | Fritchman et al. |
| 2017/0199228 | A1 | 7/2017 | Hsieh et al. |
| 2017/0214516 | A1 | 7/2017 | Rivaud et al. |
| 2017/0329391 | A1 | 11/2017 | Jaffari |

(56) References Cited

U.S. PATENT DOCUMENTS

| | | |
|---|---|---|
| 2017/0344102 A1 | 11/2017 | Kolla |
| 2017/0345490 A1 | 11/2017 | Yoshimoto et al. |
| 2017/0364818 A1 | 12/2017 | Wu et al. |
| 2018/0034549 A1 | 2/2018 | Kikuchi |
| 2018/0183413 A1 | 6/2018 | Wong |
| 2018/0365974 A1 | 12/2018 | Haas et al. |
| 2019/0019096 A1 | 1/2019 | Yoshida et al. |
| 2019/0117122 A1 | 4/2019 | Kurachi et al. |
| 2019/0305074 A1 | 10/2019 | Kande et al. |
| 2020/0028514 A1 | 1/2020 | Hanke |
| 2020/0203333 A1 | 6/2020 | Chen et al. |
| 2020/0210354 A1 | 7/2020 | Fayneh et al. |
| 2022/0260630 A1 | 8/2022 | Fayneh et al. |
| 2022/0349935 A1 | 11/2022 | Fayneh et al. |
| 2023/0098071 A1 | 3/2023 | Chonnad |

FOREIGN PATENT DOCUMENTS

| | | | |
|---|---|---|---|
| CN | 102273077 B | | 9/2014 |
| CN | 102422169 A | | 11/2014 |
| CN | 105210188 A | | 12/2015 |
| CN | 106959400 A | | 7/2017 |
| CN | 108534866 A | | 9/2018 |
| CN | 113466670 A | | 10/2021 |
| DE | 102012219971 A1 | | 7/2016 |
| EP | 2006784 A1 | | 12/2008 |
| EP | 2060924 B1 | | 5/2009 |
| EP | 2413150 A1 | | 2/2012 |
| JP | 2000215693 A | | 8/2000 |
| JP | 2002243800 A | | 8/2002 |
| JP | 2008147245 A | | 6/2008 |
| JP | 2009065533 A | | 3/2009 |
| JP | 2010161692 A | * | 7/2010 ......... H04L 25/0272 |
| JP | 2009021348 A | | 7/2013 |
| KR | 2013110989 A | | 10/2013 |
| KR | 20150073199 A | | 6/2015 |
| TW | 200914841 A | | 4/2009 |
| TW | 201614256 A | | 3/2016 |
| TW | 201709669 A | | 3/2017 |
| WO | 2005080099 A1 | | 9/2005 |
| WO | 2013027739 A1 | | 3/2015 |
| WO | 2019097516 A1 | | 5/2019 |
| WO | 2019102467 A1 | | 5/2019 |
| WO | 2019135247 A1 | | 7/2019 |
| WO | 2019202595 A1 | | 10/2019 |
| WO | 2019244154 A1 | | 12/2019 |
| WO | 2020141516 A1 | | 7/2020 |
| WO | 2020230130 A1 | | 11/2020 |
| WO | 2021019539 A1 | | 2/2021 |
| WO | 2021111444 A1 | | 6/2021 |
| WO | 2021214562 A1 | | 10/2021 |
| WO | 2022/009199 A1 | | 1/2022 |
| WO | 2022215076 A1 | | 10/2022 |
| WO | 2023238128 A1 | | 12/2023 |

OTHER PUBLICATIONS

Kan Takeuchi et al; "FEOL/BEOL wear-out estimator using stress-to-frequency conversion of voltage/temperature-sensitive ring oscillators for 28nm automotive MCUs"; IEEE, pp. 265-268, Oct. 20, 2016.

Kan Takeuchi et al; "Wear-out stress monitor utilising temperature and voltage sensitive ring oscillators" IET Circuits, Devices & Systems. vol. 12 No. 2, pp. 182-188, Jan. 15, 2018.

Kan Takeuchi et al; "Experimental Implementation of 8.9Kgate Stress Monitor in 28nm MCU along with Safety Software Library for IoT Device Maintenance"; IEEE International Reliability Physics Symposium (IRPS). Mar. 31, 2019.

Dan Ernst et al; "Razor: Circuit-Level Correction of Timing Errors for Low-Power Operation"; IEEE Computer Society. Nov. 30, 2004.

Dan Ernst et al; "Razor: A Low-Power Pipeline Based on Circuit-Level Timing Speculation"; Appears in the 36th Annual International Symposium on Microarchitecture (MICRO-36). Dec. 1, 2003.

James P. Hofmeister, et al, "Ball Grid Array (BGA) Solder Joint Intermittency Detection: SJ BIST™", IEEE Aerospace Conference Proceedings, Apr. 2008, paper #1148, Version 1.

Paulheim H, Meusel R. "A decomposition of the outlier detection problem into a set of supervised learning problems", Machine Learning, Sep. 2015, vol. 100 Issue 2, pp. 509-531.

Zhang L, Marron JS, Shen H, Zhu Z., "Singular value decomposition and its visualization", Journal of Computational and Graphical Statistics, Dec. 2007, vol. 6 Issue 4, pp. 833-854.

Shinkai, Ken-ichi et al. "Device-parameter estimation with on-chip variation sensors considering random variability."; In 16th Asia and South Pacific Design Automation Conference (ASP-DAC 2011), pp. 683-688. IEEE, Jan. 25, 2011.

Weiwei Shan et al. "An improved timing error prediction monitor for wide adaptive frequency scaling"; IEICE Electronics Express, vol. 14, No. 21, pp. 1-6, Oct. 20, 2017.

Agilent Technologies; "Clock Jitter Analysis with femto-second resolution"; Jan. 1, 2008.

Yousuke Miyake et al; "Temperature and voltage estimation using ring-oscillator-based monitor for field test"; IEEE 23rd Asian Test Symposium; pp. 156-161, Nov. 16, 2014.

Basab Datta at al; "Analysis of a Ring Oscillator Based on Chip Thermal Sensor in 65nm Technology"; Online at: https://web.archive.org/web/20140328234617/http://www-unix.ecs.umass.edu/~dkumar/lab4_658_report/lab4_report.htm; Sep. 5, 2018.

Tilman Wolf et al; "Collaborative Monitors for Embedded System Security". Jan. 1, 2006.

Sandeep Kumar Samal et al; "Machine Learning Based Variation Modeling and Optimization for 3D ICs"; J. Inf. Commun. Converg. Eng. 14(4): 258-267, Dec. 2016.

Yin-Nien Chen et al.; "Impacts of Work Function Variation and Line-Edge Roughness on TFET and FinFET Devices and 32-Bit CLA Circuits"; J. Low Power Electron. Appl. 2015, 5, 101-115. May 21, 2015.

Yong Zhao et al; "A Genetic Algorithm Based Remaining Lifetime Prediction for a VLIW Processor Employing Path Delay and IDDX Testing"; IEEE; Apr. 12, 2016.

Vivek S Nandakumar et al, "Statistical static timing analysis flow for transistor level macros in a microprocessor"; 2010, 11th International Symposium on Quality Electronic Design (ISQED), pp. 163-170, Mar. 22, 2010.

Jing Li et al, "Variation Estimation and Compensation Technique in Scaled LTPS TFT Circuits for Low-Power Low-Cost Applications"; IEEE Transactions on Computer-Aided Design of Integrated Circuits and Systems, vol. 28(1):46-59, Jan. 1, 2009.

Xie Qing et al "Variation-Aware Joint Optimization of the Supply Voltage and Sleep Transistor Size for 7nm FinFET Technology"; 2014 IEEE 32nd international conference on computer design, pp. 380-385, Oct. 19, 2014.

Rebaud B et al, "Timing slack monitoring under process and environmental variations: Application to a DSP performance optimization"; Microelectronics Journal vol. 42 Issue 5, pp. 718-732, Feb. 8, 2011.

Dierickx B et al, "Propagating variability from technology to system Level"; Physics of Semiconductor Devices, pp. 74-79, Dec. 16, 2007.

Supplementary European Search Report for European Application No. EP 19736045.6 dated Sep. 10, 2021, 3 pages.

Supplementary European Search Report for European Application No. EP 18880360.5, dated Jul. 15, 2021; 9pp.

Supplementary European Search Report for European Application No. EP 18880360.5, dated Jul. 22, 2021; 10pp.

PCT International Search Report for International Application No. PCT/IB2021/051725, mailed Jul. 12, 2021, 3pp.

PCT Written Opinion for International Application No. PCT/IB2021/051725, mailed Jul. 12, 2021, 5pp.

Nidhal Selmane, Shivam Bhasin, Sylvain Guilley, Tarik Graba, Jean-Luc Danger. "WDDL is Protected Against Setup Time Violation Attacks." CHES, Sep. 2009, Lausanne, Switzerland. pp.73-83. DOI: 10.1109/FDTC.2009.40.

(56) References Cited

OTHER PUBLICATIONS

Nidhal Selmane, Shivam Bhasin, Sylvain Guilley, Jean-Luc Danger. "Security evaluation of application-specific Integrated circuits and field programmable gate arrays against setup time violation attacks." IET Inf. Secur., 2011, vol. 5, Iss. 4, pp. 181-190. doi: 10.1049/iet-ifs.2010.0238.
Zheng K., "A Comparison of Digital Droop Detection Techniques in ASAP7 FinFET"; Research Review. Sep. 2019.
Hongge Chen, "Novel Machine Learning Approaches for Modeling Variations in Semiconductor Manufacturing," Master thesis, Jun. 2017.
Jianfeng Zhang et al, "Parameter Variation Sensing and Estimation in Nanoscale Fabrics"; Journal of Parallel and Distributed Computing; vol. 74, Issue 6, pp. 2504-2511, Jun. 1, 2014.
I. A. K. M. Mahfuzul et al, "Variation-sensitive monitor circuits for estimation of Die-to-Die process variation"; 2011 IEEE ICMTS International Conference on Microelectronic Test Structures; pp. 153-157, Apr. 4-7, 2011.
Ying Qiao et al, "Variability-aware compact modeling and statistical circuit validation on SRAM test array", Proceedings vol. 9781, Design-Process-Technology Co-optimization for Manufacturability X, Mar. 16, 2016.
David Herres, "The Eye Diagram: What is it and why is it used?"; Online at: https://www.testandmeasurementtips.com/basics-eye-diagrams/, Aug. 16, 2016.
Yu-Chuan Lin et al, "A 10-GB/s Eye-Opening Monitor Circuit for Receiver Equalizer Adaptations in 65-nm CMOS;" in IEEE Transactions on Very Large Scale Integration (VLSI) Systems, vol. 28, No. 1, pp. 23-34, Jan. 2020.
Mridul Agarwal et al., "Circuit Failure Prediction and Its Application to Transistor Aging"; 5th IEEE VLSI Test Symposium (VTS'07), pp. 277-286, May 6-10, 2007. doi: 10.1109/VTS.2007.22.
Keith A. Bowman et al., "Energy-Efficient and Metastability-Immune Resilient Circuits for Dynamic Variation Tolerance"; IEEE Journal of Solid-State Circuits vol. 44, Issue 1, pp. 49-63, Jan. 2009. doi: 10.1109/JSSC.2008.2007148.
Shidhartha Das et al., "A Self-Tuning DVS Processor Using Delay-Error Detection and Correction"; IEEE Journal of Solid-State Circuits; vol. 41, Issue 4, pp. 792-804, Apr. 2006. doi: 10.1109/JSSC.2006.870912.
Shidhartha Das et al., "RazorII: In Situ Error Detection and Correction for PVT and SER Tolerance" 2008 IEEE International Solid-State Circuits Conference—Digest of Technical Papers, Feb. 3-7, 2008. doi: 10.1109/JSSC.2008.2007145.
Ramyanshu Datta et al., "On-Chip Delay Measurement for Silicon Debug"; GLSVLSI '04: Proceedings of the 14th ACM Great Lakes symposium on VLSI; pp. 145-148, Apr. 26-28, 2004. https://doi.org/10.1145/988952.988988.
Alan Drake et al., "A Distributed Critical-Path Timing Monitor for a 65nm High-Performance Microprocessor"; 2007 IEEE International Solid-State Circuits Conference. Digest of Technical Papers; Feb. 11-15, 2007. doi: 10.1109/ISSCC.2007.373462.
Matthias Eireiner et al., "In-Situ Delay Characterization and Local Supply Voltage Adjustment for Compensation of Local Parametric Variations"; IEEE Journal of Solid-State Circuits; vol. 42, Issue 7, pp. 1583-1592, Jul. 2007. doi: 10.1109/JSSC.2007.896695.
Matthew Fojtik et al., "Bubble Razor: An architecture-independent approach to timing-error detection and correction"; 2012 IEEE International Solid-State Circuits Conference; Feb. 19-23, 2012. doi: 10.1109/ISSCC.2012.6177103.
Matthew Fojtik et al., "Bubble Razor: Eliminating Timing Margins in an ARM Cortex-M3 Processor in 45 nm CMOS Using Architecturally Independent Error Detection and Correction"; IEEE Journal of Solid-State Circuits; vol. 48, Issue 1, pp. 66-81, Jan. 2013. doi: 10.1109/JSSC.2012.2220912.
Piero Franco et al., "On-Line Delay Testing of Digital Circuits"; Proceedings of IEEE VLSI Test Symposium; Apr. 25-28, 1994. doi: 10.1109/VTEST.1994.292318.
V. Huard et al., "Adaptive Wearout Management With In-Situ Aging Monitors"; 2014 IEEE International Reliability Physics Symposium; Jun. 1-5, 2014. doi: 10.1109/IRPS.2014.6861106.
Liangzhen Lai et al., "SlackProbe: A Flexible and Efficient In Situ Timing Slack Monitoring Methodology"; IEEE Transactions on Computer-Aided Design of Integrated Circuits and Systems; vol. 33, Issue 8, pp. 1168-1179, Aug. 2014. doi: 10.1109/TCAD.2014.2323195.
M. Saliva et al., "Digital Circuits Reliability with In-Situ Monitors in 28nm Fully Depleted SOI"; 2015 Design, Automation Mar. 9-13, 2015. doi: 10.7873/DATE.2015.0238.
Martin Wirnshofer et al., "A Variation-Aware Adaptive Voltage Scaling Technique based on In-Situ Delay Monitoring"; 14th IEEE International Symposium on Design and Diagnostics of Electronic Circuits and Systems; pp. 261-266, Apr. 13-15, 2011. doi: 10.1109/DDECS.2011.5783090.
Martin Wirnshofer et al., "An Energy-Efficient Supply Voltage Scheme using In-Situ Pre-Error Detection for on-the-fly Voltage Adaptation to PVT Variations"; 2011 International Symposium on Integrated Circuits; pp. 94-97, Dec. 12-14, 2011. doi: 10.1109/ISICir.2011.6131888.
Martin Wirnshofer et al., "On-line supply voltage scaling based on in situ delay monitoring to adapt for PVTA variations"; Journal of Circuits, Systems and Computers; vol. 21, No. 08, Mar. 7, 2012. doi: 10.1142/S0218126612400270.
S. Mhira et al., "Dynamic Adaptive Voltage Scaling in Automotive environment"; 2017 IEEE International Reliability Physics Symposium (IRPS); pp. 3A-4.1-3A-4.7, Apr. 2-6, 2017. doi: 10.1109/IRPS.2017.7936279.
A. Benhassain et al., "Early failure prediction by using in-situ monitors: Implementation and application results"; Online at: https://ceur-ws.org/Vol-1566/Paper6.pdf, Mar. 18, 2016.
Charles R. Lefurgy et al., "Active Management of Timing Guardband to Save Energy in POWER7"; 2011 44th Annual IEEE/ACM International Symposium on Microarchitecture (MICRO); pp. 1-11; Dec. 3-7, 2011.
C. R. Lefurgy et al., "Active Guardband Management in Power7+ to Save Energy and Maintain Reliability"; in IEEE Micro, vol. 33, No. 4, pp. 35-45, Jul.-Aug. 2013. doi: 10.1109/MM.2013.52.
B. Zandian et al., "Cross-layer resilience using wearout aware design flow"; 2011 IEEE/IFIP 41st International Conference on Dependable Systems & Networks (DSN), pp. 279-290, Jun. 27-30, 2011. doi: 10.1109/DSN.2011.5958226.
M. Cho et al., "Postsilicon Voltage Guard-Band Reduction in a 22 nm Graphics Execution Core Using Adaptive Voltage Scaling and Dynamic Power Gating"; in IEEE Journal of Solid-State Circuits, vol. 52, No. 1, pp. 50-63, Jan. 4, 2017. doi: 10.1109/JSSC.2016.2601319.
W. Shan et al., "Timing error prediction based adaptive voltage scaling for dynamic variation tolerance"; 2014 IEEE Asia Pacific Conference on Circuits and Systems (APCCAS), pp. 739-742, Nov. 17-20, 2014. doi: 10.1109/APCCAS.2014.7032887.
J. Li et al., "Robust and in-situ self-testing technique for monitoring device aging effects in pipeline circuits"; 2014 51st ACM/EDAC/IEEE Design Automation Conference (DAC), pp. 1-6, Jun. 1-5, 2014.
X. Shang et al., "A 0.44V-1.1V 9-transistor transition-detector and half-path error detection technique for low power applications"; 2017 IEEE Asian Solid-State Circuits Conference (A-SSCC), pp. 205-208, Nov. 6-8, 2017. doi: 10.1109/ASSCC.2017.8240252.
Liangzhen Lai et al., "Accurate and inexpensive performance monitoring for variability-aware systems"; 2014 19th Asia and South Pacific Design Automation Conference (ASP-DAC), pp. 467-473, Jan. 20-23, 2014. doi: 10.1109/ASPDAC.2014.6742935.
Martin Wirnshofer et al., "Adaptive voltage scaling by in-situ delay monitoring for an image processing circuit"; 2012 IEEE 15th International Symposium on Design and Diagnostics of Electronic Circuits & Systems (DDECS), pp. 205-208, Apr. 18-20, 2012. doi: 10.1109/DDECS.2012.6219058.
Youhua Shi et al., "Suspicious timing error prediction with in-cycle clock gating"; International Symposium on Quality Electronic Design (ISQED), pp. 335-340, Mar. 4-6, 2013. doi: 10.1109/ISQED.2013.6523631.

(56) References Cited

OTHER PUBLICATIONS

Youhua Shi et al., "In-situ timing monitoring methods for variation-resilient designs"; 2014 IEEE Asia Pacific Conference on Circuits and Systems (APCCAS), pp. 735-738, Nov. 17-20, 2014. doi: 10.1109/APCCAS.2014.7032886.

Jongho Kim et al., "Adaptive delay monitoring for wide voltage-range operation"; 2016 Design, Automation & Test in Europe Conference & Exhibition (DATE), pp. 511-516, Mar. 14-18, 2016. DOI: 10.3850/9783981537079 0330.

Xiaobin Yuan et al., "Design Considerations for Reconfigurable Delay Circuit to Emulate System Critical Paths"; in IEEE Transactions on Very Large Scale Integration (VLSI) Systems, vol. 23, No. 11, pp. 2714-2718, Nov. 2015. oi: 10.1109/TVLSI.2014.2364785.

\* cited by examiner

DIE-TO-DIE CONNECTIVITY MONITORING

CROSS-REFERENCE TO RELATED APPLICATIONS

This application is a continuation of U.S. patent application Ser. No. 17/205,780, filed Mar. 18, 2021 now U.S. Pat. No. 11,293,977, entitled "Die-to-Die Connectivity Monitoring," which claims priority to PCT Patent Application No. PCT/IB2021/051725, filed Mar. 2, 2021, entitled "Die-to-Die Connectivity Monitoring," and to U.S. Provisional Patent Application No. 63/012,457, filed Apr. 20, 2020, entitled "Die-to-Die (Tile) Connectivity Degradation Monitoring Based On Eye Measurement", which are all incorporated by reference as if fully set forth herein.

FIELD OF THE INVENTION

The invention relates to the field of integrated circuits.

BACKGROUND

Semiconductor integrated circuits (ICs) typically include analog and digital electronic circuits on a flat semiconductor substrate, such as a silicon wafer. Microscopic transistors are printed onto the substrate using photolithography techniques to produce complex circuits of billions of transistors in a very small area, making modern electronic circuit design using ICs both low cost and high performance. ICs are produced in assembly lines of factories, termed foundries, which have commoditized the production of ICs, such as complementary metal-oxide-semiconductor (CMOS) ICs.

Typically, ICs are produced in large batches on a single wafer of electronic-grade silicon (EGS) or other semiconductor (such as GaAs). The wafer is cut (diced) into many pieces, each containing one copy of the circuit. Each of these pieces is called a 'die.'

Digital ICs are typically packaged in a metal, plastic, glass, or ceramic casing. The casing, or 'package,' is connected to a circuit board, such as by using solder. Types of packages include a lead frame (though-hole, surface mount, chip-carrier, and/or the like), pin grid array, chip scale package, ball grid array, and/or the like, to connect between the IC pads and the circuit board.

Some modern ICs are in fact a module made up of multiple interconnected ICs (sometime referred to as "chips" or "chiplets") that are configured to cooperate. A typical example is a logic IC interconnected with a memory IC, but many other types exist. There are also many die-to-die (namely, IC-to-IC) connectivity technologies in existence. One example is wafer-level integration featuring high-density connectivity, that is based on a Re-Distribution Layer (RDL) and Through Integrated Fan-Out Vias (TIVs), for instance as marketed by Taiwan Semiconductor Manufacturing Company (TSMC), Limited. Another example is system-level integration featuring individual chips bonded through micro-bumps on a silicon interposer, for instance the Chip on Wafer on Substrate (CoWoS) technology marketed by TSMC Limited, and the Embedded Interconnect Bridge (EMIB) technology marketed by Intel Corporation. Both enable High Bandwidth Memory (HBM) subsystems. A third example is three-dimensional (3D) chip stacking technology based on Through Silicon Vias (TSVs), for instance the Chip on Wafer (CoW) and Wafer on Wafer (WoW) technologies marketed by TSMC Limited.

The foregoing examples of the related art and limitations related therewith are intended to be illustrative and not exclusive. Other limitations of the related art will become apparent to those of skill in the art upon a reading of the specification and a study of the figures.

SUMMARY

The following embodiments and aspects thereof are described and illustrated in conjunction with systems, tools and methods which are meant to be exemplary and illustrative, not limiting in scope.

In an embodiment, there is provided an input/output (I/O) sensor for a multi-IC (Integrated Circuit) module. The I/O sensor comprises: delay circuitry, configured to receive a data signal from an interconnected part of an IC of the multi-IC module and to generate a delayed data signal, the delay circuitry comprising an adjustable delay-line configured to delay an input signal by a set time duration; a comparison circuit, configured to generate a comparison signal by comparing the data signal with the delayed data signal; and processing logic, configured to set the time duration of the adjustable delay-line and, based on the comparison signal, identify a margin measurement of the data signal for determining an interconnect quality parameter.

In embodiments, the processing logic is configured to: for each of a plurality of time durations, set the adjustable delay-line to the respective time duration and determine whether the comparison signal for the respective time duration indicates a pass or a fail condition; and identify a minimum time duration from the plurality of time durations for which the comparison signal indicates a fail condition.

In embodiments, the processing logic is configured to repeat, for each of a plurality of measurement cycles, setting the adjustable delay-line to each of the plurality of time durations and identifying the minimum time duration and wherein the processing logic is further configured to determine one or more of: a lowest minimum time duration over the plurality of measurement cycles; a highest minimum time duration over the plurality of measurement cycles; and a sum of minimum time durations over the plurality of measurement cycles.

In embodiments, the interconnect quality parameter comprises one or more of: an eye pattern parameter; a micro-bump resistance parameter; a systematic effect parameter; and a parameter indicating a symmetry of differential signals.

In embodiments, the margin measurement comprises one of: a data signal setup time to clock rising edge; a data signal setup time to clock falling edge; a data signal hold time to clock rising edge; and a data signal hold time to clock falling edge.

In embodiments, the comparison circuit comprises an XOR gate. In embodiments, the adjustable delay-line has a resolution of at least 1 ps and/or at least 16 configurations for the time duration.

In embodiments, the data signal is provided as the input signal to the adjustable delay-line and the data signal and the delayed data signal are sampled according to a clock signal. In embodiments, the data signal is sampled according to the clock signal and the clock signal is provided as the input signal to the adjustable delay-line to provide a delayed clock signal, the delayed data signal being the data signal sampled according to the delayed clock signal.

In embodiments, the delay circuitry further comprises: a first state-element, configured to receive a first state-element input signal and to provide a first state-element output based on the first state-element input signal and a first clock input;

a second state-element, configured to receive a second state-element input signal and to provide a second state-element output based on the second state-element input signal and a second clock input; and a multiplexing arrangement, configured selectively to apply: (i) the data signal as the input signal to the adjustable delay-line, an output of the adjustable delay-line being provided as the first state-element input signal, the data signal being provided as the second state-element input signal and a clock signal being provided as the first and second clock inputs; or (ii) the clock signal as the input signal to the adjustable delay-line, an output of the adjustable delay-line being provided as the first clock input, the data signal being provided as the first and second state-element input signals and the clock signal being provided as the second clock input.

In embodiments, the multiplexing arrangement is further configured to selectively apply as the clock signal: (a) a positive clock signal; or (b) a negative clock signal that is the positive clock signal inverted.

According to embodiments, there is provided an input/output (I/O) block, comprising a plurality of I/O sensors, each I/O sensor being as disclosed herein and being configured to receive a respective, different data signal from an interconnected part of the IC of the multi-IC module.

In embodiments, the processing logic of each of the plurality of I/O sensors is located in a control block that is common of all the I/O sensors.

In embodiments, each I/O sensor is configured to receive a respective data signal from a different pin of the interconnected part of the IC of the multi-IC module, and, in parallel with the other sensors, identify a margin measurement for the respective pin.

According to embodiments, there is provided an input/output (I/O) block for a multi-IC module, the I/O block comprising: a receive buffer, configured to receive a voltage signal from an interconnected part of the semiconductor IC and to provide a receive buffer output; an I/O sensor as herein disclosed, wherein the receive buffer output is provided as the data signal input to the delay circuitry.

In embodiments, the I/O sensor is further configured to receive a clock signal input, a clock signal associated with the received voltage signal being provided as the clock signal input.

In embodiments, the receive buffer is a first receive buffer and is configured to receive a first voltage signal from a first interconnected part of the semiconductor IC and provide a first receive buffer output, the I/O sensor being further configured to receive a clock signal input and wherein the I/O block further comprises: a second receive buffer, configured to receive a second voltage signal from a second interconnected part of the semiconductor IC and to provide a second receive buffer output; and wherein the second receive buffer output with a delay applied is provided as the clock signal input.

In embodiments, the I/O sensor is a first I/O sensor, the clock signal input being a first clock signal input, the I/O block further comprising: a second I/O sensor as disclosed herein, wherein the second receive buffer output is provided as the data signal input to the delay circuitry, the second I/O sensor being further configured to receive a second clock signal input; and wherein the first receive buffer output with a delay applied is provided as the second clock signal input.

In embodiments, the I/O block further comprises: a multiplexing arrangement, configured to selectively apply: (a) the first receive buffer output as the data signal input to the I/O sensor and the second receive buffer output with a delay applied as the clock signal input to the I/O sensor; or (b) the second receive buffer output as the data signal input to the I/O sensor and the first receive buffer output with a delay applied as the clock signal input to the I/O sensor.

In embodiments, the first and second interconnected parts of the IC form a differential channel.

In embodiments, the I/O block is located on the IC of the multi-IC module and is configured to interface with an external processor for storing of the identified margin measurement and/or determining the interconnect quality parameter.

According to embodiments, there is provided an input/output (I/O) monitoring system, comprising a plurality of I/O blocks, each I/O block being as herein disclosed, all of the plurality of I/O blocks being controlled by a common I/O controller According to embodiments, there is provided an IC of a multi-IC module, comprising an input/output (I/O) block as herein described or an input/output (I/O) monitoring system as herein described.

In some embodiments, there may considered a computer readable medium, having instructions stored thereupon for carrying out any of the method embodiments disclosed herein, when said instructions are performed by a processor.

In addition to the exemplary aspects and embodiments described above, further aspects and embodiments will become apparent by reference to the figures and by study of the following detailed description. The skilled person will appreciate that combinations and sub-combinations of specific features disclosed herein may also be provided, even if not explicitly described.

BRIEF DESCRIPTION OF THE FIGURES

Exemplary embodiments are illustrated in referenced figures. Dimensions of components and features shown in the figures are generally chosen for convenience and clarity of presentation and are not necessarily shown to scale. The figures are listed below.

DETAILED DESCRIPTION

Figure 1:
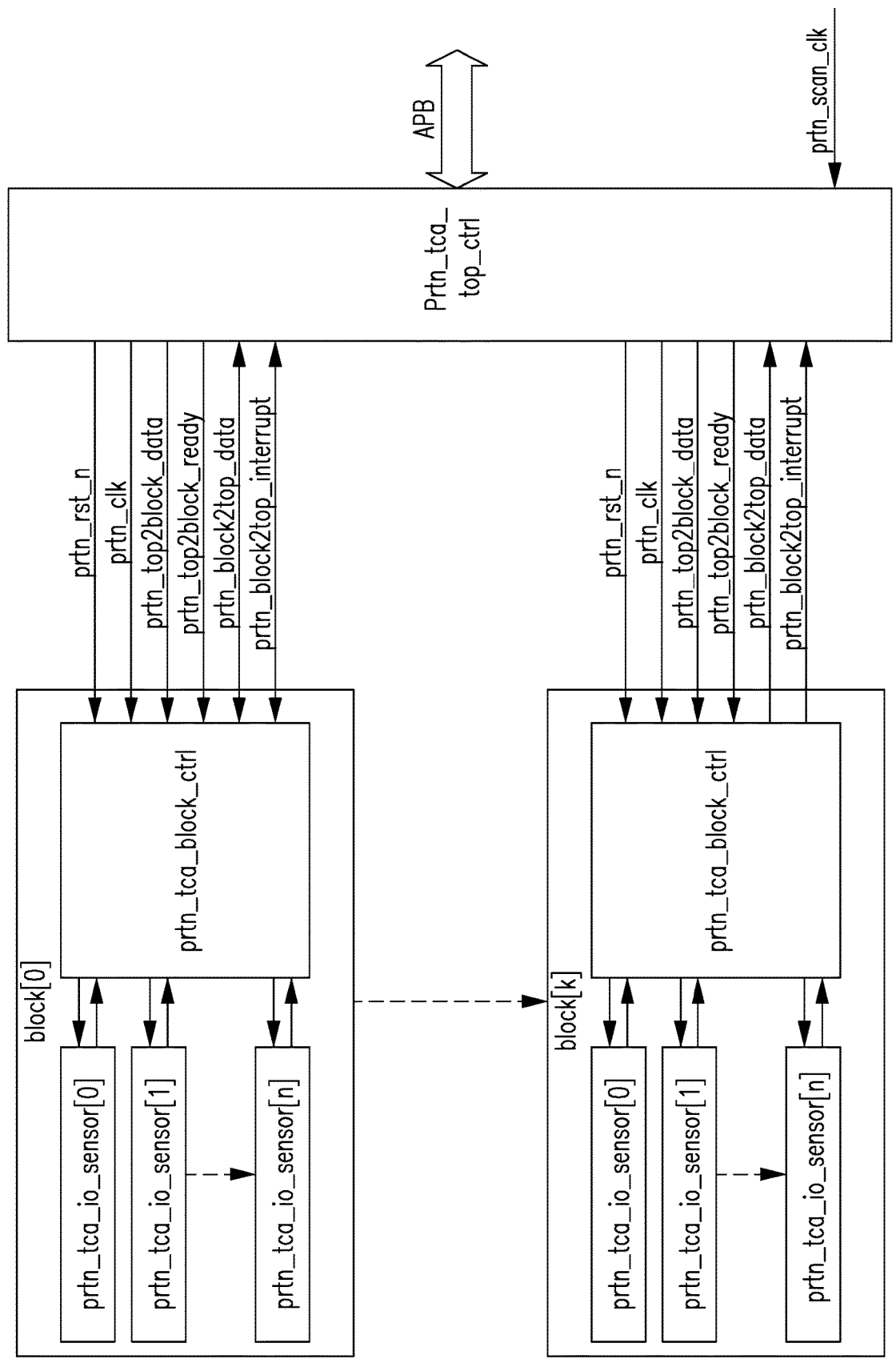
FIG. 1 shows a schematic block diagram of a die-to-die connectivity monitoring system in accordance with the disclosure.

Disclosed herein are devices, systems, and methods to measure and/or to estimate input/output (I/O) margin and/or eye pattern parameter and/or integrity and/or degradation of multi-IC modules (sometimes referred to as "multi-chip modules"), and/or to optimize the power and/or performance for such multi-IC modules.

The term 'multi-IC module,' as referred to herein, may describe a group of interconnected ICs that are integrated and packaged together, and are configured to cooperate through this interconnection in order to achieve a certain joint functionality. The ICs in the module may communicate with each other through an interconnect bus, for example. Their physical integration may be horizontal, vertical, or both.

The multi-IC module to which this disclosure relates may be constructed by any known or later introduced integration technology, which either provides for direct connection between ICs, or indirect connection through an intermediary such as a certain interposer, substrate, circuit board, and/or the like. It is also possible for a multi-IC module to employ both direct and indirect connectivity between various pairs of its integrated ICs. Examples of today's multi-IC module integration technologies include Chip on Wafer on Substrate (CoWoS), Wafer On Wafer (WoW), Chip On Wafer (CoW), and 3D IC. However, embodiments of the invention are certainly beneficial also for any other type of multi-IC module which feature die-to-die (IC-to-IC) connectivity.

The disclosed devices, systems, and methods include die-to-die connectivity monitoring, particularly determining the quality of the connectivity of a high-speed die-to-die interconnect. Such interconnects may implement wide buses and/or low power (picojoules/bit). Quality issues can be the cause of open-circuit, short-circuit, bridge-short (signal to signal), micro-bump resistance degradation at the receiver side, and/or micro-bump resistance degradation at the transmitter side. In this case, the timing of the signal at the receiver is expected to change and the change can be detected by the monitoring system. Timing effects and power effects of this monitoring are minimal.

HBM3 (High Bandwidth Memory 3) is one type of die-to-die connectivity that implements different types of lanes: bidirectional lanes, receive-only lanes, transmit-only lanes, and differential lanes. Each of these lane types may be monitored in a different way, as discussed herein.

The margin need not be measured by looking at timing differences between signals, but instead by comparing a received data signal with that data signal delayed using an adjustable delay-line set to provide a predetermined time delay. If the comparison results in a pass, the margin is higher than the delay applied to the data signal. The minimum delay applied to the data signal that causes the comparison to result in a fail may be considered the margin.

Using an adjustable delay-line in this way allows high resolution to be achieved on the margin measurement. Existing direct time measurement has a relatively poor resolution, for example around one-buffer delay, which is technology-dependent and can be in the range of 10 picoseconds (ps). In contrast, resolution of around 2 ps (fraction of a buffer delay) may be achieved using techniques according to the disclosure.

A key application is eye measurement for characterization, in particular measuring the margin to fail or the performance per pin or lane. An input/output (I/O) sensor is located per receiver at each lane. The delay of the adjustable delay-line is gradually shifted (adjusted in small increments) until a fail is detected. The I/O-sensor may be configured for four modes in order to fully characterize the eye opening at the receiver side. For degradation monitoring, the adjustable delay line position may be stored and compared against ongoing life-time measurements. For eye width characterization, the delay line position may be used to measure the setup time to fail.

In a general sense, there may be considered an I/O sensor for a semiconductor IC. The I/O sensor comprises delay circuitry, configured to receive a data signal from an interconnected part of the semiconductor IC (for example, at a pin or lane of one IC within a multi-IC module) and to generate a delayed data signal. The delay circuitry comprises an adjustable delay-line configured to delay an input signal by a set time duration (although, as will be discussed below, the delayed data signal need not be the output of the adjustable delay-line). The I/O sensor further comprises a comparison circuit, configured to generate a comparison signal by comparing the data signal with the delayed data signal. Further provided is processing logic, configured to set the time duration of the adjustable delay-line and, based on the comparison signal, identify a margin measurement of the data signal for determining an interconnect quality parameter. According to this general sense, there may also be provided a method of manufacturing and/or operating an I/O sensor comprising corresponding steps of providing and or configuring an I/O sensor accordingly.

The processing logic may be configured to: set the adjustable delay-line to each of a plurality of time durations and, for each time duration set, determine whether the comparison signal for the respective time duration indicates a pass or a fail condition. The processing logic may then be configured to identify, from the plurality of time durations for which the comparison signal indicates a fail condition, the minimum value of these time durations. This minimum value may correspond with the margin measurement.

The margin measurement may comprise one of: a data signal setup time to clock rising edge; a data signal setup time to clock falling edge; a data signal hold time to clock rising edge; and a data signal hold time to clock falling edge. Multiple margin measurements may be determined for the same interconnect (pin or lane) and each may be for a different margin of those listed here.

The interconnect quality parameter may, for instance, comprise one or more of: an eye pattern parameter; a micro-bump resistance parameter; a systematic effect parameter; and a parameter indicating a symmetry of differential signals. These may be determined from the margin measurement, optionally with other factors.

Other specific features will now be discussed. Generalized senses will be further considered again below.

Reference is made to FIG. 1, which depicts a schematic block diagram of a die-to-die connectivity monitoring system, particularly but not exclusively for a 3D IC. The same system can be used for monitoring any type of die-to-die connectivity and not just a 3D IC. In a 2.5D packaging, the interconnects (the lanes) are connecting chips that are adjacent to each other, for example, a DRAM controller located in a System on Chip (SoC) to a DRAM located in a stacked DRAM (HBM3). In a 3D packaging, the interconnects (the lanes) are connecting chips that are stacked on each other, for example, a DRAM controller located at the bottom of the stack (a first chip) to SRAM dies that stacked on each other. In other packaging types, the connectivity can be described as a transmitter that drives a line with a receiver in its end and the die-to-die connectivity monitoring system can still be used. However, the system is advantageous for a 3D IC, in that there is area limitation and the system can use a single I/O-sensor to serve multiple receivers.

The die-to-die connectivity monitoring system detects reliability issues in mission mode per pin and enables margin characterization performance in four measurement modes per pin. The quality monitoring is based on (ongoing) tracking of the received-signal (Rx signal) timing at the receiver. The monitoring is performed for each lane with minimal timing and power penalty. Possible quality issues can be related to open pins, short pins, bridge-short (signal to signal), micro-bump resistance degradation at the receiver side, and/or micro-bump resistance degradation at the transmitter side.

The die-to-die connectivity monitoring system supports a number [k] of I/O-blocks, each block supporting a number [n] of I/O-lanes. The I/O lanes can be bi-directional (providing transmission and reception), receive-only, transmit-only and/or differential lanes. The measurement process of each block is managed by a dedicated controller (Prtn_tca_block_controller) located within the block. The block controller controls [n] I/O-sensors (one for each lane or pin).

Configuration data and control signals are passed from the block controller to the I/O-sensors and fail indication data is passed from each I/O-sensor to the respective block controller. In a measurement cycle, all of the [n] I/O-sensors are activated in parallel to measure the margin to fail of each of the [n] pins. At the end of the measurement cycle, the controller holds the margin to fail of each pin, which is represented by a digital readout of 6 bits in an embodiment.

All the block controllers are controlled by a central Full-Chip (FC) controller (prtn_tca_top_ctrl). The FC-controller generates a low-frequency clock (Prtn_clk) that is used to activate finite state machines (FSMs) within the block controllers. The low-frequency clock (Prtn_clk) signal is generated from an Advanced Peripheral Bus (APB) clock. The frequency division is programmable and relative to the APB clock. The FC-controller also generates a central active low reset signal (prtn_rst_n) for all the block controllers. The FC-controller collects the data from each of the block controllers and transmits the data to an external source via a serial bus (for instance, using APB, JTAG, $I^2C$).

In a characterization stage, an offline data-analytics system receives the margin data via the external source and uses this data to measure or calculate one or more of: eye width per pin; eye height per pin; clock duty cycle effects on eye width per pin; eye width and/or eye height jitter amplitude per pin; systematic effects per group of pins; and symmetry of differential signals.

In mission mode, an offline data-analytics system receives the margin data via the external source and uses this data to calculate the eye width degradation and/or micro-bump resistance degradation at the receiver side, and/or micro-bump resistance degradation at the transmitter side and/or degradation of the differential lanes micro-bumps. This may include one or more of: outlier detection; systematic shift detection; alerts; and lane repair.

Data analysis from a large number of such die-to-die connectivity monitoring systems, each embedded in a different IC, may be advantageously performed at an analytics system. The analytics system may be a computerized system including one or more hardware processor(s) (e.g., CPUs), a random-access memory (RAM), one or more non-transitory computer-readable storage device(s), and a network interface controller (NIC). The storage device(s) may have stored thereon program instructions and/or components configured to operate the hardware processor(s). The program instructions may include one or more software modules, such as a data analysis module that analyzes the margin data received from ICs operating in the field.

The software components may include an operating system having various software components and/or drivers for controlling and managing general system tasks (e.g., memory management, storage device control, power management, network communication, etc.), and facilitating communication between various hardware and software components.

The analytics system may operate by loading instructions of the data analysis module into the RAM as they are being executed by the processor(s). The instructions of the data analysis module may cause the analytics system to receive, such as through its network interface controller (e.g., through the Internet) margin data gathered from multiple ICs, process it, and output statistical analysis of the data. The statistical analysis may be indicative, for example, of eye pattern parameters (including eye width), degradation rates, lanes and/or pins commonly disintegrating or degrading faster, etc. Based on the analysis performed at the system, one or more of the ICs may be reconfigured to adjust one or more of data throughput, clock rate and processing time. In this respect, the system may transmit a message to each IC to be reconfigured, through the NIC of the system, via a communication network (such the Internet) and the communication interfaces of these ICs. The message may include an instruction on how to set or change internal IC parameters to affect the data flow or clock speed. The instruction may be individual to each IC, respective of specific margin data of that IC. Alternatively, a same instruction may be transmitted to multiple ICs whose statistical analysis classified as closely related.

The analytics system as described herein is only an exemplary embodiment of the present invention, and in practice may be implemented in hardware only, software only, or a combination of both hardware and software. The analytics system may have more or fewer components and modules than shown, may combine two or more of the components, or may have a different configuration or arrangement of the components. The analytics system may include any additional component enabling it to function as an operable computer system, such as a motherboard, data busses, power supply, a display, an input device (e.g., keyboard, pointing device, touch-sensitive display), etc. Moreover, components of the analytics system may be co-located or distributed, or the analytical system could run as one or more cloud computing "instances," "containers," and/or "virtual machines," as known in the art.

Figure 2:
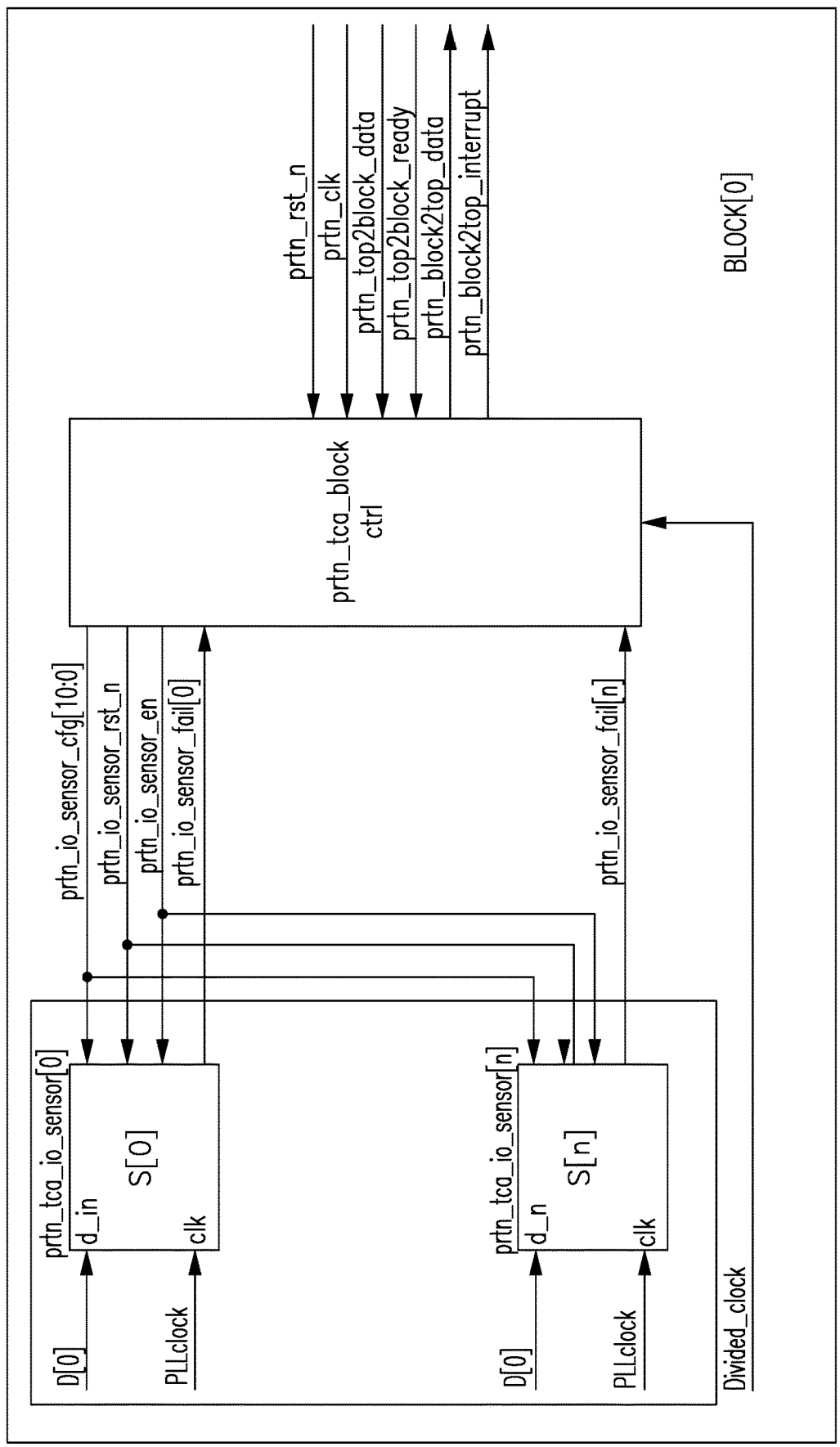
FIG. 2 shows a schematic block diagram of an input/output (I/O) block for use in the die-to-die connectivity monitoring system.

With reference to FIG. 2, there is shown a schematic block diagram of an I/O block. This describes connectivity of the block controller to the I/O-sensors (I/O-sensor pin names are the same as the signal names). The signals will be discussed in more detail below.

The block controller (Prtn_tca_block_controller) is clocked by a Phase Locked Loop (PLL) divided clock (in an embodiment, equal to 1 GHz for a 10 GHz PLL clock and division of 10) and by the low-frequency clock (Prtn_clk) generated by the FC-controller. The PLL clock is provided by a PLL block. The divided clock is therefore a derivative of the main clock that is used for the data transmission. The two clocks are distinct.

The divided PLL clock is used to synchronize the Sensor-fail indication signal and for the internal FSMs. The low-frequency clock (Prtn_clk) is used to interface with the FC controller, obtain commands and measurement readouts. As will be discussed below, each I/O sensor is clocked by the PLL clock (10 GHz, as discussed above). The margin to fail data is related to the rising edge of this clock.

Figure 3:
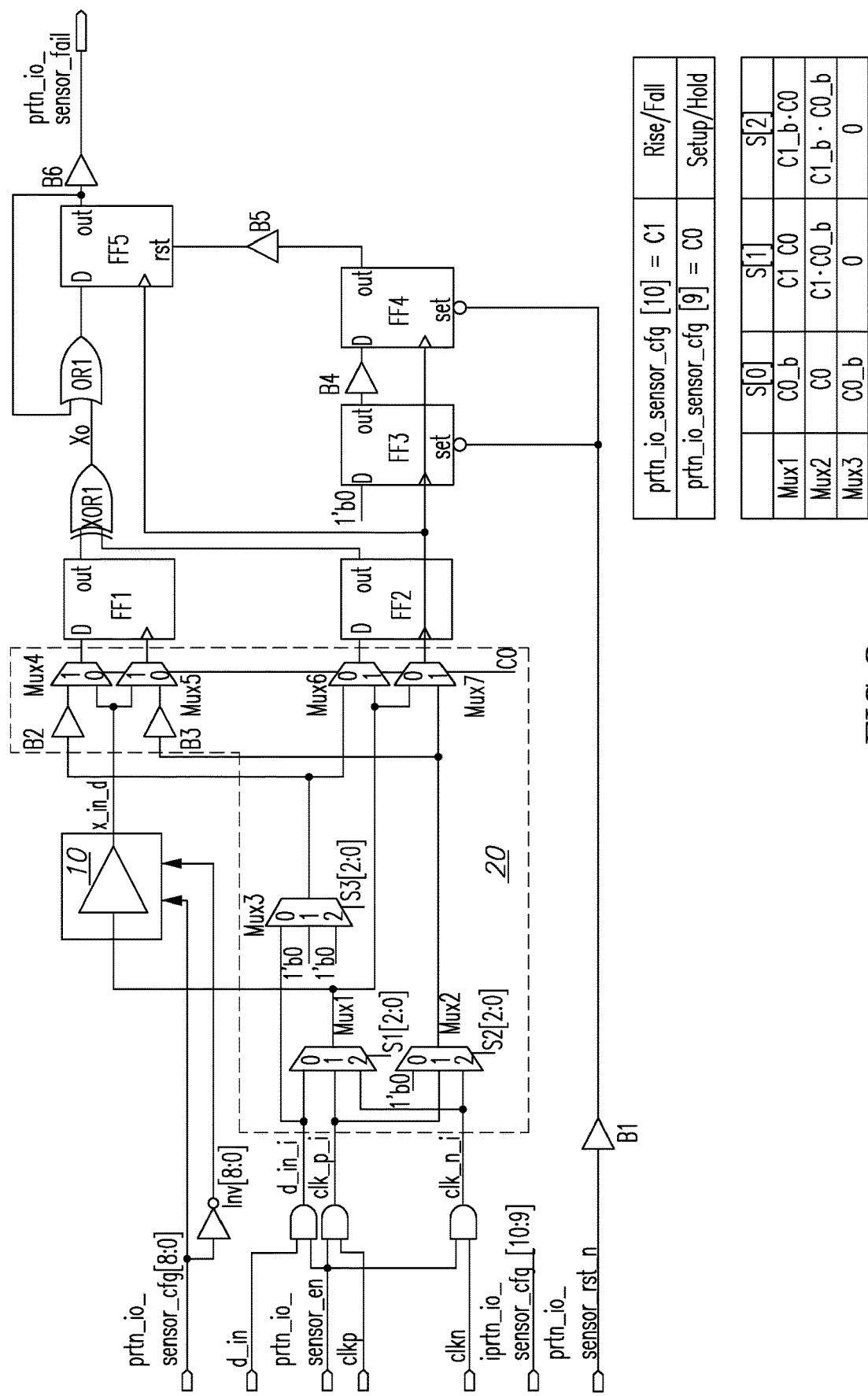
FIG. 3 shows a schematic circuit diagram of an I/O sensor forming part of the I/O block.

With reference to FIG. 3, there is illustrated a schematic circuit diagram of an I/O sensor forming part of the I/O block. As discussed above, a key input to the I/O sensor is a clock signal, which is the undivided clock provided from the PLL block. In practice, the clock signal may be provided in two forms: a positive clock signal (clkp); and a negative clock signal that is an inverted form of the positive clock signal (clkn). Another input is a data signal from the pin or lane being measured (d_in). Configuration signals (ptrn_io_sensor_cfg) are also provided as an input to the I/O sensor. An activation signal (ptrn_io_sensor_en) is a further input to the I/O sensor.

The key components of the I/O sensor are: an adjustable delay-line 10; and a XOR comparison logic gate that provides an output comparison signal (X0). The adjustable delay-line provides an output signal (x_in_d) that is a version of its input delayed by a set, configurable time duration. A number of state-elements or sampling elements or flip-flops (FFs) are also provided, with a first state-element (FF1) and a second state-element (FF2) being the most relevant, as the outputs of these two state-elements are the two inputs to the XOR comparison logic gate. The I/O sensor also comprises a signal multiplexing arrangement 20, which configures the inputs to the adjustable delay-line, first state-element (FF1) and second state-element (FF2). Each of the state-elements has two inputs: a respective data signal input; and a respective clock signal input. If the outputs of the first and second state-elements are the same, the output comparison signal (X0) will be a logical low value, indicating a pass result that the margin is less than delay duration set. If the outputs of the first and second state-elements are different, the output comparison signal (X0) will be a logical high value, indicating a fail result that the margin is less than or equal to the delay duration set.

The input signals are processed to define further signals. The data signal (d_in) and the activation signal (ptrn_io_sensor_en) are provided as inputs to a first AND gate to define a processed data signal (d_in_i). The positive clock signal (clkp) and the activation signal (ptrn_io_sensor_en) are provided as inputs to a second AND gate to define a processed positive clock signal (clk_p_i). The negative clock signal (clkn) and the activation signal (ptrn_io_sensor_en) are provided as inputs to a third AND gate to define a processed negative clock signal (clk_n_i).

The signal multiplexing arrangement 20 comprises: a first multiplexer (Mux1); a second multiplexer (Mux2); a third multiplexer (Mux3); a fourth multiplexer (Mux4); a fifth multiplexer (Mux5); a sixth multiplexer (Mux6); and a seventh multiplexer (Mux7). Of course, the use of seven multiplexers is merely an illustrative example, and any number of multiplexers may be used as required for the specific implementation, while adhering to the principles described herein. The first multiplexer (Mux1) is controlled by a first 3-bit multiplexer control signal (S1) and provides a first multiplexer output by selecting between the inputs: the processed data signal (d_in_i); the processed positive clock signal (clk_p_i); and the processed negative clock signal (clk_n_i). The first multiplexer output is the input to the adjustable delay-line.

The second multiplexer (Mux2) is controlled by a second 3-bit multiplexer control signal (S2) and provides a second multiplexer output by selecting between the inputs: a constant logical low signal (1'b0); the processed positive clock signal (clk_p_i); and the processed negative clock signal (clk_n_i). The third multiplexer (Mux3) is controlled by a third 3-bit multiplexer control signal (S3) and provides a third multiplexer output by selecting between the inputs: the processed data signal (d_in_i); a constant logical low signal (1'b0); and a constant logical low signal (1'b0).

The fourth multiplexer (Mux4), fifth multiplexer (Mux5), sixth multiplexer (Mux6) and seventh multiplexer (Mux7) are all controlled by a one-bit common control signal (C0). For each of these multiplexers, the first input listed is provided as the output if the common control signal is a high logic level and the second input listed is provided as the output if the common control signal is a low logic level. The fourth multiplexer (Mux4) provides a fourth multiplexer output by selecting between the inputs: the third multiplexer output; and the adjustable delay-line output signal (x_in_d). The fourth multiplexer output is the data input to the first state-element (FF1). The fifth multiplexer (Mux5) provides a fifth multiplexer output by selecting between the inputs: the adjustable delay-line output signal (x_in_d); and the second multiplexer output. The fifth multiplexer output is the clock input to the first state-element (FF1). The sixth multiplexer (Mux6) provides a sixth multiplexer output by selecting between the inputs: the third multiplexer output; and the first multiplexer output. The sixth multiplexer output is the data input to the second state-element (FF2). The seventh multiplexer (Mux6) provides a seventh multiplexer output by selecting between the inputs: the first multiplexer output; and the second multiplexer output. The seventh multiplexer output is the clock input to the second state-element (FF2).

The I/O sensor is capable to measure relative timing characteristics of the data and clock signal and by appropriate configuration of the signal multiplexing arrangement, measurement is possible of: data signal setup time to clock rising edge; data signal setup time to clock falling edge; data signal hold time to clock rising edge; and data signal hold time to clock falling edge. These configurations will be discussed further below.

The I/O-sensor is configured by setting the configuration signal (the value of prtn_io_sensor_cfg[10:0] configuration bits). The 11 configuration bits are responsible for three types of functionality: four configuration bits (prtn_io_sensor_cfg[3:0]) configure the adjustable delay-line value that is changed dynamically during a margin test; five configuration bits (prtn_io_sensor_cfg[8:4]) are configured according to the frequency of operation (equal to half of the data rate) and do no not change during a margin test; two configuration bits (prtn_io_sensor_cfg[10:9]) configure the measurement mode.

An example of how the five configuration bits (prtn_io_sensor_cfg[8:4]) may be configured according to the frequency of operation is provided in Table 1 below.

TABLE 1

| Config <8:4> | Minimum Frequency (GHz) | Maximum Frequency (GHz) |
|---|---|---|
| 00000 | 1.7 | 1.9 |
| 00001 | 2 | 2.7 |
| 00010 | 2.8 | 3.6 |
| 00110 | 3.7 | 5.2 |
| 01110 | 5.3 | 7 |
| 11110 | 7.1 | 8 |

During the measurement cycle (which is explained in more detail below), the block controller configures the internal adjustable delay-line of each I/O-sensor using the four configuration (prtn_io_sensor_cfg[3:0]) reserved for that purpose. This allows up to 16 different delay time periods to be set for a margin measurement. The minimum delay-line value is configured by prtn_io_sensor_cfg[3:0]=[00000] and the maximum delay-line value is configured by prtn_io_sensor_cfg[3:0]=[11111].

The four different margin measurement modes will now be discussed in more detail. The first mode to be considered is measurement of data signal setup time to clock rising edge. In this mode, the first multiplexer (Mux1) is controlled to provide the first multiplexer output as the processed data signal (d_in_i), the second multiplexer (Mux2) is controlled to provide the second multiplexer output as the processed positive clock signal (clk_p_i) and the common control signal (C0) is set to a logical low value. The third multiplexer output is not relevant and can therefore be set at the constant logical low signal (1′b0). As a result, the first state-element is configured to sample the delayed data signal by the positive clock signal and the second state-element is configured to sample the data signal (that is, without delay) by the positive clock signal. The XOR comparison logic gate therefore tests whether the data signal and the delayed data signal, when both sampled by the same clock rising edge, are the same.

The measurement of data signal setup time to clock falling edge is achieved as follows. In this mode, the first multiplexer (Mux1) is controlled to provide the first multiplexer output as the processed data signal (d_in_i), the second multiplexer (Mux2) is controlled to provide the second multiplexer output as the processed negative clock signal (clk_n_i) and the common control signal (C0) is set to a logical low value. The third multiplexer output is not relevant and can therefore be set at the constant logical low signal (1′b0). As a result, the first state-element is configured to sample the delayed data signal by the negative clock signal and the second state-element is configured to sample the data signal (that is, without delay) by the negative clock signal. The XOR comparison logic gate therefore tests whether the data signal and the delayed data signal, when both sampled by the same clock negative clock rising edge, are the same.

Figure 4:
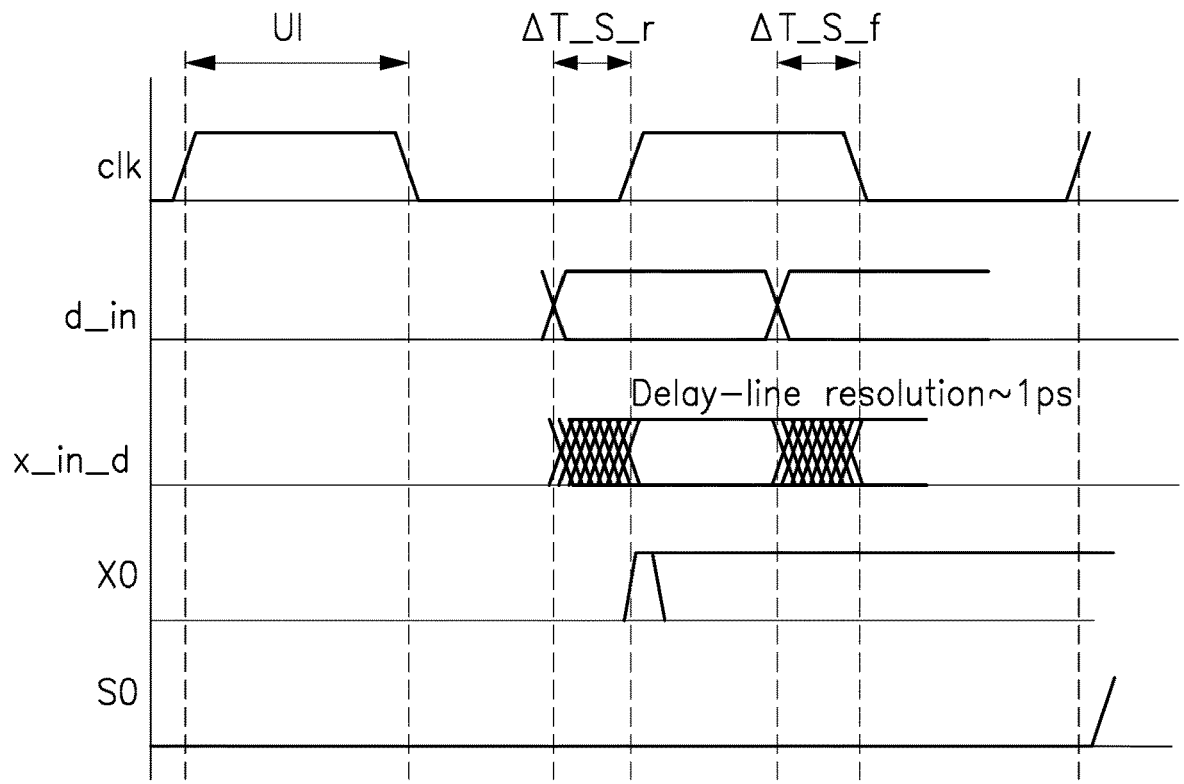
FIG. 4 shows a waveform timing diagram for monitoring a margin parameter with reference to a setup time in accordance with the disclosure.

Reference is now made to FIG. 4, which shows a waveform timing diagram for monitoring a margin parameter with reference to a setup time. The top waveform shows the clock signal (clk), showing the UI (Unit Interval), which defines the minimum data width. For example, a system using a Dual Data Rate (DDR) generates data at the rising edge of the clock and at the falling edge of the clock, such that UI is equal to the time interval between the rising and falling edge of the clock. The second waveform is the data signal (d_in). From this, the setup time to clock rising edge ($\Delta T\_S\_r$) and the setup time to clock falling edge ($\Delta T\_S\_f$) can be seen. The delayed data signal (x_in_d), which is the output from the adjustable delay-line, is also shown, indicating a range of different delays dependent on the delay duration set for the adjustable delay-line. Also shown is the output comparison signal (X0) for a specific delayed data signal (x_in_d), which in the case shown, indicates a logical high and thus that the margin is at least the delay duration set. A sensor output signal (SO) corresponds with a sensor fail indication signal (ptrn_io_sensor_fail). This is a sticky bit that stays at a logical high level after the first fail until reset and will discussed further below.

The measurement of data signal hold time to clock rising edge is achieved as follows. In this mode, the first multiplexer (Mux1) is controlled to provide the first multiplexer output as the processed positive clock signal (clk_p_i), the third multiplexer (Mux3) is controlled to provide the third multiplexer output as the processed data signal (d_in_i) and the common control signal (C0) is set to a logical high value. The second multiplexer output is not relevant and can therefore be set at the constant logical low signal (1′b0). In this case, the output of the adjustable delay-line is a delayed positive clock signal. The data signal is not provided as in input to the adjustable delay-line. As a result, the first state-element is configured to sample the data signal by the delayed positive clock signal. The output of the first state-element is therefore a delayed data signal, with the delay introduced by sampling. The second state-element is configured to sample the data signal by the positive clock signal (that is, without delay). The XOR comparison logic gate therefore tests whether the data signal sampled by the clock rising edge and the data signal sampled by the delayed clock rising edge (that is, the delayed data signal) are the same.

The measurement of data signal hold time to clock falling edge is achieved as follows. In this mode, the first multiplexer (Mux1) is controlled to provide the first multiplexer output as the processed negative clock signal (clk_n_i), the third multiplexer (Mux3) is controlled to provide the third multiplexer output as the processed data signal (d_in_i) and the common control signal (C0) is set to a logical high value. The second multiplexer output is not relevant and can therefore be set at the constant logical low signal (1′b0). In this case, the output of the adjustable delay-line is a delayed negative clock signal. The data signal is again not provided as in input to the adjustable delay-line. As a result, the first state-element is configured to sample the data signal by the delayed negative clock signal. The output of the first state-element is again thereby a delayed data signal, with the delay introduced by sampling. The second state-element is configured to sample the data signal by the negative clock signal (that is, without delay). The XOR comparison logic gate therefore tests whether the data signal sampled by the negative clock rising edge and the data signal sampled by the delayed negative clock rising edge (that is, the delayed data signal) are the same.

Figure 5:
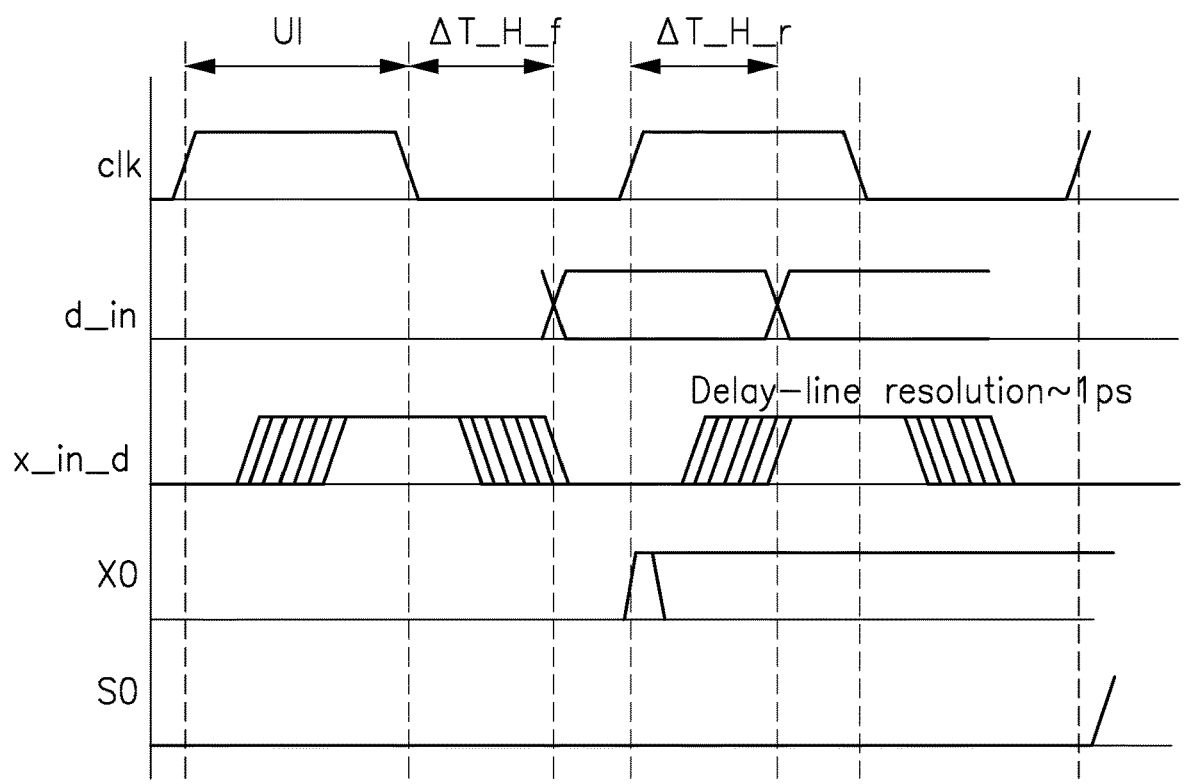
FIG. 5 shows a waveform timing diagram for monitoring a margin parameter with reference to a hold time in accordance with the disclosure.

Reference is now made to FIG. 5, which shows a waveform timing diagram for monitoring a margin parameter with reference to a hold time. The top waveform shows the clock signal (clk) and the second waveform is the data signal (d_in). From this, the hold time to clock falling edge ($\Delta T\_H\_f$) and the setup time to clock rising edge ($\Delta T\_H\_r$) can be seen. The delayed clock signal (x_in_d), which is the output from the adjustable delay-line, is also shown, indicating a range of different delays dependent on the delay duration set for the adjustable delay-line. Also shown is the output comparison signal (X0) for a specific delayed clock signal (x_in_d), which in the case shown, indicates a logical high and thus that the margin is at least the delay duration set. The sensor output signal (SO) is as discussed above with reference to FIG. 4 and an example for its generation will be detailed below.

As discussed above, two bits of the configuration signal (prtn_io_sensor_cfg) are used to configure the I/O-sensor to one of the four measurement modes. A first of these bits (prtn_io_sensor_cfg[9]) is the common control signal (C0) that configures the I/O-sensor to either setup or hold measurement. If the common control signal (C0, prtn_io_sensor_cfg[9]) is a logical low value ([0]), then the I/O-sensor is configured to a setup measurement mode and if the common control signal (C0, prtn_io_sensor_cfg[9]) is a logical high value ([1]), then the I/O-sensor is configured to a hold measurement mode. A second of these bits (C1, prtn_io_sensor_cfg[10]) determines whether the clocking rising edge or the clock falling edge is used for reference. If this second bit (C1, prtn_io_sensor_cfg[10]) is a logical low value ([0]), then the I/O-sensor is configured to Clock-Fall (negative) measurement mode and if the second bit (C1, prtn_io_sensor_cfg[10]) is a logical high value ([1]), then the I/O-sensor is configured to Clock-Rise (positive) measurement mode.

The I/O-sensor may use these two configuration bits to configure the signal multiplexing arrangement by the following logic equations in Table 2:

TABLE 2

| | | S[0] | S[2] | S[2] |
|---|---|---|---|---|
| Setup/Hold | Mux1 | C0_b | C1 · C0 | C1_b · C0 |
| Rise/Fall | Mux2 | C0 | C1 · C0_b | C1_b · C0_b |
| [C0, C1] | Mux3 | C0_b | [0] | [0] |
| Setup/Fall | Mux1 | [1] | [0] | [0] |
| C0 = [0] | Mux2 | [0] | [0] | [1] |
| C1 = [0] | Mux3 | [1] | [0] | [0] |
| Setup/Rise | Mux1 | [1] | [0] | [0] |
| C0 = [0] | Mux2 | [0] | [1] | [0] |
| C1 = [1] | Mux3 | [1] | [0] | [0] |
| Hold/Fall | Mux1 | [0] | [0] | [1] |
| C0 = [1] | Mux2 | [1] | [0] | [0] |
| C1 = [0] | Mux3 | [0] | [0] | [0] |
| Hold/Rise | Mux1 | [0] | [1] | [0] |
| C0 = [1] | Mux2 | [1] | [0] | [0] |
| C1 = [1] | Mux3 | [0] | [0] | [0] |

Returning to the generalized sense discussed above, further features may be considered. For example, the comparison circuit may comprise an XOR gate. Then, the comparison signal may be based on an output of the XOR gate. One input to the XOR gate may be the data signal and the other input may be the delayed data signal. The adjustable delay-line may have a resolution of at least 1 ps. Additionally or alternatively, the adjustable delay-line may have at least 16 configurations for the time duration.

In certain configurations, the data signal may be provided as the input signal to the adjustable delay-line and the data signal and the delayed data signal are sampled according to a clock signal. In other configurations, the data signal is sampled according to the clock signal and the clock signal is provided as the input signal to the adjustable delay-line to provide a delayed clock signal. Then, the delayed data signal may be the data signal sampled according to the delayed clock signal.

The delay circuitry may further comprise: a first state-element (for instance, a flip-flop), configured to receive a first state-element input signal and to provide a first state-element output based on the first state-element input signal and a first clock input; a second state-element (for instance, a flip-flop), configured to receive a second state-element input signal and to provide a second state-element output based on the second state-element input signal and a second clock input; and a multiplexing arrangement. The multiplexing arrangement is advantageously configured selectively to apply one of two configurations. In the first configuration, the data signal is applied as the input signal to the adjustable delay-line, an output of the adjustable delay-line is provided as the first state-element input signal, the data signal is provided as the second state-element input signal and a clock signal is provided as the first and second clock inputs. In the second configuration, the clock signal is applied as the input signal to the adjustable delay-line, an output of the adjustable delay-line is provided as the first clock input, the data signal is provided as the first and second state-element input signals and the clock signal is provided as the second clock input. The multiplexing arrangement may be further configured to selectively apply as the clock signal: (a) a positive clock signal; or (b) a negative clock signal that is the positive clock signal inverted.

In another general sense (which may be combined with any other aspect disclosed herein), there may be considered an I/O block, comprising a plurality of I/O sensors, each I/O sensor being as disclosed herein and being configured to receive a respective, different data signal from an interconnected part of the semiconductor IC. The processing logic of each of the plurality of I/O sensors may be located in a common control block. Each I/O sensor may be configured to receive a respective data signal from a different pin of the interconnected part of the semiconductor IC and, in parallel with the other sensors, identify a margin measurement for the respective pin.

The I/O block may be located on the semiconductor IC. Then, the I/O block may be configured to interface with an external processor for storing of the identified margin measurement and/or determining the interconnect quality parameter.

According to another general sense (which may also be combined with any other disclosure herein), there may be provided an I/O monitoring system, comprising a plurality of I/O blocks, each I/O block being as herein disclosed. Then, each of the plurality of I/O blocks may be controlled by a common I/O controller.

A few generalized senses may be considered as a semiconductor IC comprising an I/O block as herein described or an I/O monitoring system as herein described. As discussed above, there may also be provided a method of manufacturing and/or operating an I/O block, I/O monitoring system and/or semiconductor IC comprising corresponding steps of providing and or configuring an I/O sensor accordingly.

The I/O sensor also comprises a test verification portion, including: a third state-element (FF3); a fourth state-element (FF4); an OR gate (OR1); and a fifth state-element (FF5). The output comparison signal (X0) is provided as a first input to the OR gate (OR1) and the output of the OR gate (OR1) is a data input to the fifth state-element (FF5). The clock input to the fifth state-element (FF5) is the seventh multiplexer output (which as noted above, is the positive clock signal if a rising edge measurement is being made and the negative clock signal if a falling edge measurement is being made). The output of the fifth state-element (FF5) is provided as a second input to the OR gate (OR1). This output (which is provided through a buffer) indicates a sensor fail indication signal (ptrn_io_sensor_fail), which is held to a logical high value as soon as the output comparison signal (X0) becomes high. This corresponds with the sensor output signal (SO), discussed above.

The sensor fail indication signal (ptrn_io_sensor_fail) is one bit coming from each I/O-sensor, which thereby indicates that the adjustable delay-line configuration is equal or bigger than margin of the pin, that is the time difference between the data-rise and clock-rise. As noted above, the fail indication is generated by the I/O-sensor using a sticky mechanism, that is when the fail indication is raised, it will stay at a logical high level until the next I/O-sensor reset (as will be discussed below). The sensor indication is always related to active or current configuration mode of the I/O-sensor.

The third state-element (FF3) and the fourth state-element (FF4) form a two-stage synchronizer used to reset the fifth state-element (FF5) and thereby reset the test failure signal (ptrn_io_sensor_fail). The clock input to both the third state-element (FF3) and the fourth state-element (FF4) is the seventh multiplexer output (as discussed above). A data input to the third state-element (FF3) is a constant logical low signal (1'b0) and a data input to the fourth state-element (FF4) is the output of the third state-element (FF3). An input of an active-low asynchronous reset signal (ptrn_io_sensor_rst_n) is also provided as a set signal input to both the third state-element (FF3) and the fourth state-element (FF4). The output of the fourth state-element (FF4) is provided as reset signal to the fifth state-element (FF5). Hence, the fifth state-element (FF5) is used to synchronize the sensor fail indication signal to the fast clock. The serial structure of the third state-element (FF3) and the fourth state-element (FF4) is used to avoid meta-stability.

The block controller (prtn_tca_block_ctrl) generates the reset signal (prtn_io_sensor_rst_n) that is distributed to all the I/O-sensors in the block. The reset signal is related to the PLL divided clock domain that is used to clock the block controller (prtn_tca_block_ctrl). To do this, the block controller may use a block reset signal (prtn_rst_n) that is generated by the FC-controller (prtn_tca_top_ctrl), synchronized to the PLL divided clock.

The reset signal is generated by the block controller unsynchronized to the I/O-sensor operation clock (10 GHz clock, in this illustrative example) and is used in the I/O-sensor as an asynchronous reset. The I/O-sensor reset assertion is hence unsynchronized to the 10 GHz clock. A reset should be asserted before any change in the adjustable delay-line configuration. The 10-sensor reset de-assertion is synchronized within the I/O-sensor to the I/O-sensor operation clock (10 GHz) clock. The synchronization is performed using the two-stage synchronizer located within each of the I/O-sensors. The reset de-assertion time is equal to two 10 GHz clock cycles.

The I/O-sensor is activated by setting the activation signal (prtn_io_sensor_en) to a high logic level ([1]). This is performed one clock cycle (PLL divided clock cycle) before the reset de-assertion. When the I/O-sensor is de-activated, the activation signal (prtn_io_sensor_en) is set to low logic level ([0]) one clock cycle (PLL divided clock cycle) after the reset assertion.

In general terms, there may be considered an input/output (I/O) sensor for a semiconductor three-dimensional (3D) integrated circuit (IC). The I/O sensor comprises: delay circuitry, configured to receive a data signal from an interconnected part of the semiconductor 3D IC (which may be bidirectional interface) and to generate a delayed data signal; and a comparison circuit, configured to generate a comparison signal by comparing the data signal with the delayed data signal. The delay circuitry comprises an adjustable delay-line configured to delay an input signal by a set time duration. The I/O sensor further comprises processing logic, configured to set the time duration of the adjustable delay-line and, based on the comparison signal, identify a margin measurement of the data signal for determining an eye pattern parameter. Some or all of the processing logic may be co-located with the remainder of the I/O sensor and some or all of the processing logic may located remotely from the I/O sensor. Part or all of the processing logic may be shared between more than one I/O sensor. A method of measuring a I/O margin comprising steps of providing and/or operating features of the I/O sensor described herein may also be understood.

There may also be considered an input/output (I/O) block, comprising a plurality of I/O sensors. In this case, each I/O sensor may be configured to receive a respective, different data signal, particularly from a different interconnected part of the semiconductor 3D IC, for example a different lane or pin. Where each I/O sensor is configured to receive a respective data signal from a different pin of the interconnected part of the semiconductor 3D IC, each I/O sensor may be configured to identify a margin measurement for the respective pin in parallel with the other sensors. Some or all of the processing logic of each of the plurality of I/O sensors of the I/O block is advantageously located in a common control block. The I/O sensor and/or I/O block may be located on the semiconductor 3D IC. The I/O sensor and/or I/O block may then be configured to interface with an external processor for storing of the identified margin measurement and/or determining the eye pattern parameter.

In a further aspect, an input/output (I/O) monitoring system, comprising a plurality of I/O blocks may also be considered. Each of the plurality of I/O blocks may be controlled by a common I/O controller.

Yet another aspect may be found in a semiconductor three-dimensional (3D) integrated circuit (IC) comprising an input/output (I/O) sensor and/or I/O block and/or I/O monitoring system as herein described.

Referring again to the I/O sensor (optionally within an I/O block, I/O monitoring system or 3D IC), further optional, preferable and/or advantageous features may be considered.

The margin measurement may comprise, for example, one of: a data signal setup time to clock rising edge; a data signal setup time to clock falling edge; a data signal hold time to clock rising edge; and a data signal hold time to clock falling edge.

For each of a plurality of time durations, the processing logic may set the adjustable delay-line to the respective time duration and determine whether the comparison signal for the respective time duration indicates a pass or a fail condition. Then, the processing logic may identify a minimum time duration from the plurality of time durations for which the comparison signal indicates a fail condition. Optionally, the processing logic may repeat, for each of a plurality of measurement cycles: setting the adjustable delay-line to each of the plurality of time durations; and identifying the minimum time duration. Then, the processing logic may further determine one or more of: a lowest minimum time duration over the plurality of measurement cycles; a highest minimum time duration over the plurality of measurement cycles; and a sum of minimum time durations over the plurality of measurement cycles.

Optionally, the adjustable delay-line has a resolution of at least 1 ps at maximum frequency of operation (optionally, 2 ps or relative to the frequency of operation) and/or at least 16 (optionally, 32) configurations for the time duration.

In embodiments, the comparison circuit comprises an XOR gate. A first input to the XOR gate may be provided by the data signal (advantageously, sampled) and a second input to the XOR gate may be provided by the delayed data signal.

In certain modes of operation, the data signal is provided as the input signal to the adjustable delay-line and the data signal and the delayed data signal are sampled according to a clock signal. In other modes of operation, the data signal is sampled according to the clock signal and the clock signal is provided as the input signal to the adjustable delay-line to provide a delayed clock signal. Then, the delayed data signal may be the data signal sampled according to the delayed clock signal.

Modes of operation may be controlled by a multiplexing arrangement. For example, the delay circuitry may further comprise: a first state-element, configured to receive a first state-element input signal and to provide a first state-element output based on the first state-element input signal and a first clock input; a second state-element, configured to receive a second state-element input signal and to provide a second state-element output based on the second state-element input signal and a second clock input; and a multiplexing arrangement, configured selectively to apply: (i) the data signal as the input signal to the adjustable delay-line, an output of the adjustable delay-line being provided as the first state-element input signal, the data signal being provided as the second state-element input signal and a clock signal being provided as the first and second clock inputs; or (ii) the clock signal as the input signal to the adjustable delay-line, an output of the adjustable delay-line being provided as the first clock input, the data signal being provided as the first and second state-element input signals and the clock signal being provided as the second clock input. The multiplexing arrangement may be further configured to selectively apply as the clock signal: (a) a positive clock signal; or (b) a negative clock signal that is the positive clock signal inverted.

Although the disclosure has now been discussed in general terms, further specific details will again be considered below.

Figure 6:
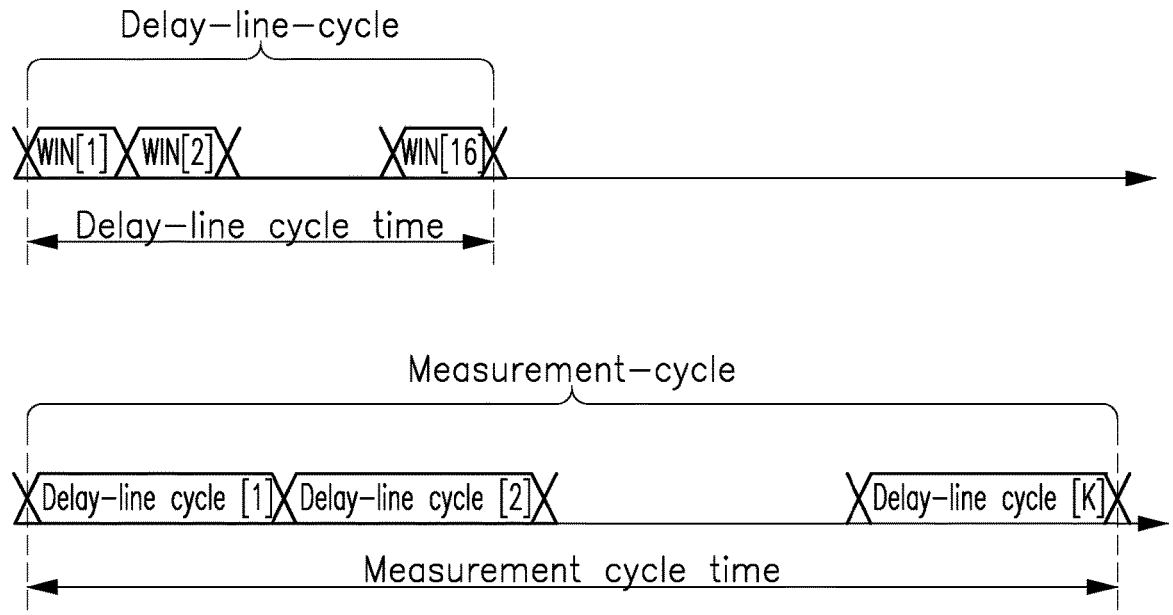
FIG. 6 shows a waveform timing diagram for operation of the die-to-die connectivity monitoring system over a measurement cycle.

With reference to FIG. 6, there is shown a waveform timing diagram for operation of the die-to-die connectivity monitoring system over a measurement cycle. A measurement cycle defines the activity of the block controller during the measurement time interval. Each measurement cycle comprises a plurality [K] of delay-line cycles. Each delay-line cycle comprises a plurality (in an embodiment, 16) measurements, each with a different position of the adjustable delay-line. The number of measurements per each delay-line cycle may be, in a more general sense, between 2 and 100, or more specifically 2-10, 2-20, 2-30, 2-40, 2-50, 5-10, 5-20, 5-30, 5-40, 5-50, 10-20, 10-20, 10-30, 10-40, 10-50, 20-30, 20-40, 20-50, 30-40, 30-50, 40-50, or any other sub-range between 2 and 100. In other embodiments, the number of measurements per each delay-line cycle may exceed 100.

The measurement cycle starts when a measurement command is sent to the block controller (prtn_tca_block_ctrl) and it stops when a read cycle is executed. To perform a new measurement cycle, a new measurement command is sent. When the block controller receives a read command, it will first disable the I/O-sensor by setting the activation signal (ptrn_io_sensor_en) signal to a logic low level.

During each of the adjustable delay-line cycles, the I/O-sensor adjustable delay-line is configured to each of its 16 positions, that is the I/O-sensor adjustable delay-line is changed from its minimum delay value to its maximum delay value. The time interval that it stays at each of the positions is defined by the "WIN" parameter. The WIN parameter is configurable to one of 8, 16, 32 and 64, and the time interval is equal to the WIN configuration times the PLL output time interval divided by the clock cycle time.

Figure 7:
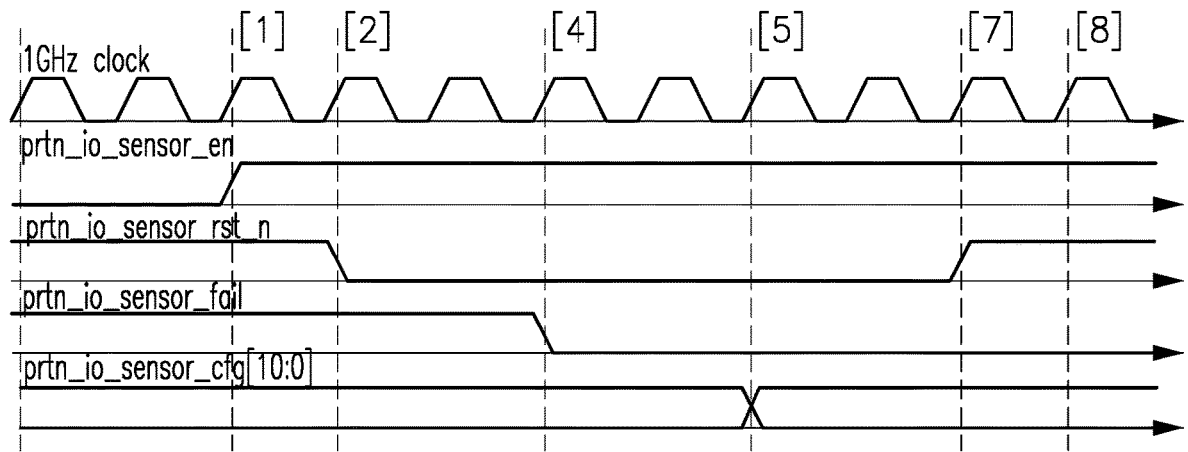
FIG. 7 shows a waveform timing diagram for activation and reset of an I/O sensor in accordance with FIG. 3.

With reference to FIG. 7, there is shown a waveform timing diagram for activation and reset of an I/O sensor in accordance with FIG. 3. The time to set a new delay-line value is the sum of: the time that it takes for the block controller (prtn_tca_block_ctrl) to reset the fifth state-element (FF5) that controllers the sensor fail indication signal (ptrn_io_sensor_fail); the time to set a new delay-line value (position of the adjustable delay line); and a guard band time. It is calculated as 8 cycles of the PLL divided clock (1 GHz in this example), in line with the following sequence: first cycle to set the active-low asynchronous reset signal (ptrn_io_sensor_rst_n) [2]; wait two cycles to reset the sensor fail indication signal (ptrn_io_sensor_fail) [4]. The delay-line cycle length is equal to: [16×WIN]+[32×time to set a new adjustable delay-line value].

Figure 8:
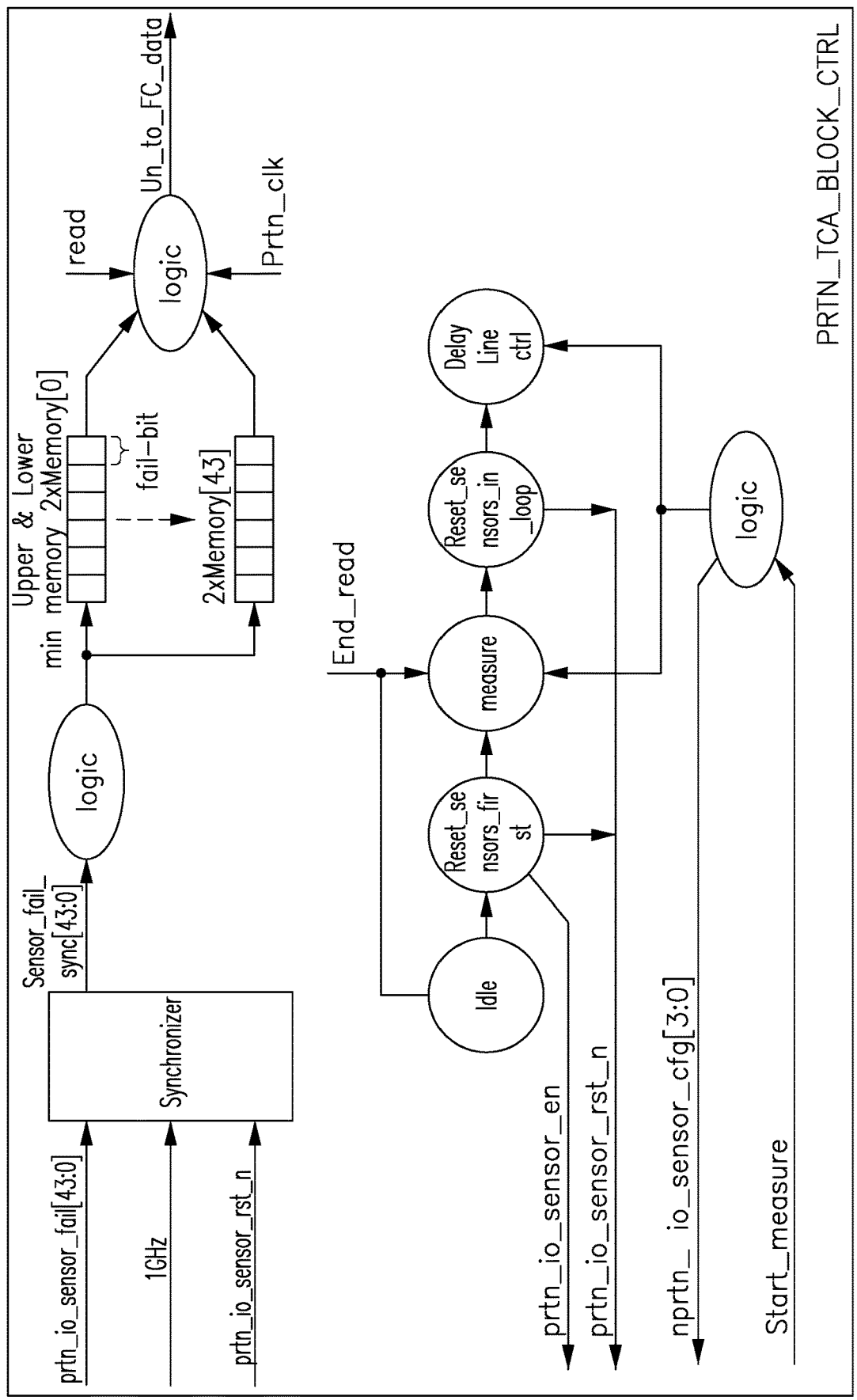
FIG. 8 shows a schematic block diagram of an I/O block controller forming part of the I/O block.

With reference to FIG. 8, there is illustrated a schematic block diagram of an I/O block controller forming part of the I/O block. This comprises: a synchronizer; a first logic; a memory block; and a second logic. A third logic generates the activation signal (ptrn_io_sensor_en), the active-low asynchronous reset signal (ptrn_io_sensor_rst_n) and the four configuration bits that configure the adjustable delay-line value (ptrn_io_sensor_cfg [3:0]).

The synchronizer receives the one bit sensor fail indication signal (ptrn_io_sensor_fail) for each of a plurality (in this case, 44, [43:0]) different sensors, the PLL (1 GHz) clock signal and the active-low asynchronous reset signal (ptrn_io_sensor_rst_n) and provides a synchronized sensor fail signal for each sensor (sensor_fail_sync[43:0]) to the first logic. The first logic then determines the minimum delay line position that generates a sensor fail and provides this to the memory block. The Memory block should store the minimum delay-line position that generates a sensor-fail during a full delay-line cycle (16 delay-line positions exercised by 16 WIN intervals) for each pin. The second logic can be used to read out from the memory block to the FC controller.

When the third logic in the block controller (prtn_tca_block_ctrl) receives a start measurement (start_measure) command, it first enables the I/O-sensor by setting the activation signal (ptrn_io_sensor_en) to a logic high value. Then it activates a measurement cycle.

Four data types are generated by the block controller per I/O-sensor (pin), to provide a total of 33 bits (or 31 bits depending on a count_length configuration). The first type is the lower minimum delay-line position that generates a sensor-fail during a full measurement cycle ([N]×delay-line cycles) and this requires 5 bits per I/O-sensor (memory [4:0]). The second type is the upper minimum delay-line position that generates a sensor-fail during a full measurement cycle ([N]×delay-line cycles) and this requires 5 bits per IO-sensor (memory [4:0]). The third type is a validity bit that indicates that the lower Minimum delay-line position readout (first type) and the upper minimum delay-line position readout (second type) corresponds to a real fail indication. Specifically, this bit indicates that the IO-sensor output, that is the sensor fail indication signal (prtn_io_sensor_fail), was a logical high level at least once during the measurement cycle.

The fourth type is a sum of the minimum delay-line positions that generates a sensor-fail during each of the delay-line-cycles (one measurement cycle). This requires 14 bits (5+9) per I/O-sensor if Count_length=512 and 13 bits (5+8) per I/O-sensor if Count_length=256. The fifth type is the number of valid delay-line cycles that are used in the sum of the minimum delay-line values (Count) and this requires 9 bits per I/O-sensor (up to 512 counts). The fourth and fifth type are optional and depend on the readout mode (Readout_mode), which can be configured to: a regular mode that reads 11 bits per I/O-sensor (total of 44×11=484 bits that is approximately 61 Bytes); a debug mode that reads 33 bits per I/O-sensor (total of 44×33=1452 that is approximately 181 Bytes) for Count_length=512 or reads 31 bits per I/O-sensor (total of 44×31=1364 that is approximately 171 bytes) for Count_length=256.

While running in the WIN interval, the block controller checks the sensor fail indication signal for each sensor (prtn_io_sensor_fail[43:0]). The signal is synchronized to the PLL divided clock inside the block controller, using the synchronizer. When the sensor fail indication signal (prtn_io_sensor_fail) is a logical high value, the block controller stores the value of the delay-line position that was exercised during the WIN interval at Memory[x], but only if the delay-line position is smaller than the one stored in Memory [x].

The first 5 bits ([4:0]) of Memory[x] store the delay-line position and the sixth bit ([5]) of Memory[x] is the validity (valid) bit. The validity bit is set to a logical high value when the sensor fail indication signal (prtn_io_sensor_fail) for the sensor ([x]) is first time found to be a logical high value. At the end of the delay-line cycle, the memory for the sensor ([x]) will store the Minimum delay-line value that is corresponds to the margin of each pin.

The block controller (prtn_tca_block_controller) stores the minimum value of the adjustable delay-line that results in a fail from all the delay-line measurement cycles as well as the maximum between all the minimum values of the adjustable delay-line that results in a fail measured over all the delay-lines measurement cycles. It will also store the sum of up to 512 delay-line cycles, minimum delay-line values measured, and the count of how many measurement cycles were summed.

The communication between the block controller (prtn_tca_block_controller) to the I/O-sensors within the block implements high Fan-Out (FO) connectivity. The propagation delay of these signals is advantageously defined to optimize the efficiency of the test, that is to optimize the active time of test against the full test time.

To assure best operation of the I/O-sensor, the signals that are driving the I/O-sensor should arrive with a well-defined slope to the input of the I/O-sensor. Table 3 below defines the propagation time and the signal slope (at the I/O-sensor input) of each of the signals (between the block-controller and I/O-sensor, optionally in both directions).

TABLE 3

|  | Propagation time [ns] | Slope (10-90%) [ns] |
| --- | --- | --- |
| Prtn_io_sensor_cfg[10:0] | <1 ns | 0.03 |
| Prtn_io_sensor_en | <1 ns | 0.03 |
| Prtn_io_sensor_fail[n:0] | <1 ns | 0.03 |
| Prtn_io_sensor_rst_n | <1 ns | 0.03 |

With further reference to the generalized sense discussed above, the processing logic may be configured to repeat, for each of a plurality of measurement cycles, setting the adjustable delay-line to each of the plurality of time durations and identifying the minimum time duration. Then, the processing logic may be further configured to determine one or more of: a lowest minimum time duration over the plurality of measurement cycles; a highest minimum time duration over the plurality of measurement cycles; and a sum of minimum time durations over the plurality of measurement cycles.

Figure 9:
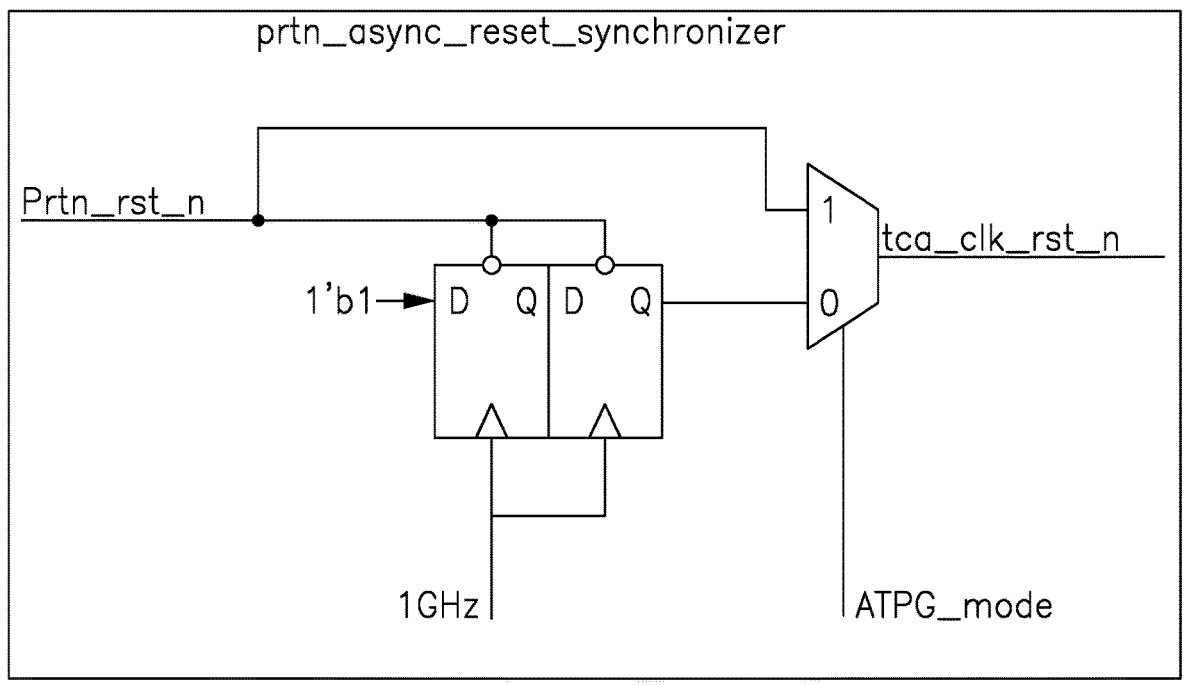
FIG. 9 shows a schematic circuit diagram of a portion of the I/O block controller of FIG. 8, configured for Automatic Test Pattern Generation (ATPG) mode and sensor reset.

With reference to FIG. 9, there is depicted a schematic circuit diagram of a portion of the I/O block controller of FIG. 8, configured for Automatic Test Pattern Generation (ATPG) mode. In particular, this comprises two series state-elements (D flip-flops), both clocked by the PLL clock (1 GHz), with the first state-element having a constant logic high value (1'b1) as a data input and providing its output (Q) as a data input to the second state-element. Both state-elements have the central active low reset signal (prtn_rst_n) from the FC-Controller as a reset input and this signal is also provided as a first input (for a logical low value) of a multiplexer. The output (Q) of the second state-element is provided as a second input (for a logical high value) of the multiplexer.

Figure 10:
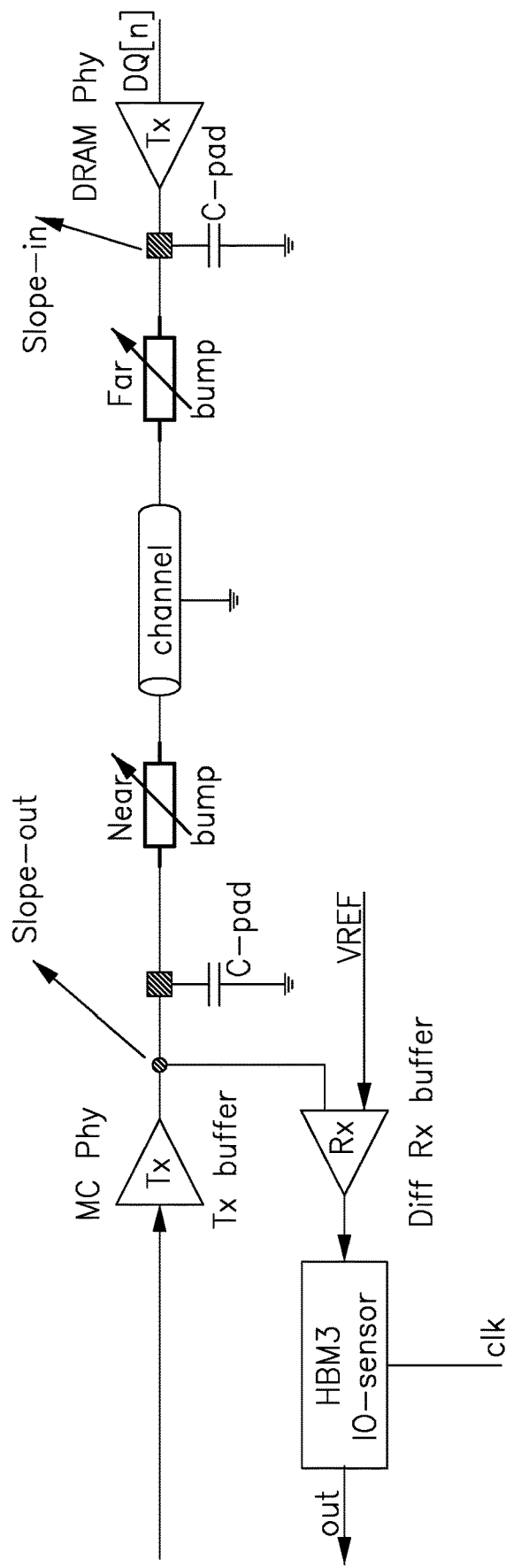
FIG. 10 shows a schematic circuit diagram of an implementation of an I/O sensor in accordance with the disclosure for the monitoring of degradation of a bidirectional or receive-only interconnect signal channel.

With reference to FIG. 10, there is shown a schematic circuit diagram of an implementation of an I/O sensor in accordance with the disclosure for the monitoring of degradation of a bidirectional or receive only signal interconnect channel (lane). This implementation is particularly used for High Bandwidth Memory 3 (HBM3) semiconductor 3D IC packages. The interconnect signal channel has a Near End (NE) bump (connection, such as a soldered pin) and a Far End (FE) bump. Pads at the NE and FE have a capacitance (shown schematically by a capacitor, labelled C-pad). At the FE, which in this example is at a Dynamic Random Access Memory (DRAM) part of the 3D IC, a Physical layer (Phy) transmission buffer receives an input (DQ[n]) and this is received at a NE (pseudo) Differential Receive Buffer (Diff Rx buffer), which compares the received signal with a threshold voltage (VREF). The output of the NE Differential Receive Buffer is provided as the data input to the I/O sensor, which also receives the clock (clk). In a bidirectional channel, a Main Chip (MC) physical layer (Phy) transmitter is also provided with a transmission buffer (Tx buffer). The degradation of the transition slope for the transmitted signal (from Slope-in to Slope-out) is shown and this determines the margin. The receive buffer can alternatively be implemented as a CMOS receiver (or another type of receive buffer) and in such case, it need not receive or perform a comparison with a threshold voltage (VREF). This is applicable to other differential receive buffers disclosed below.

Figure 11:
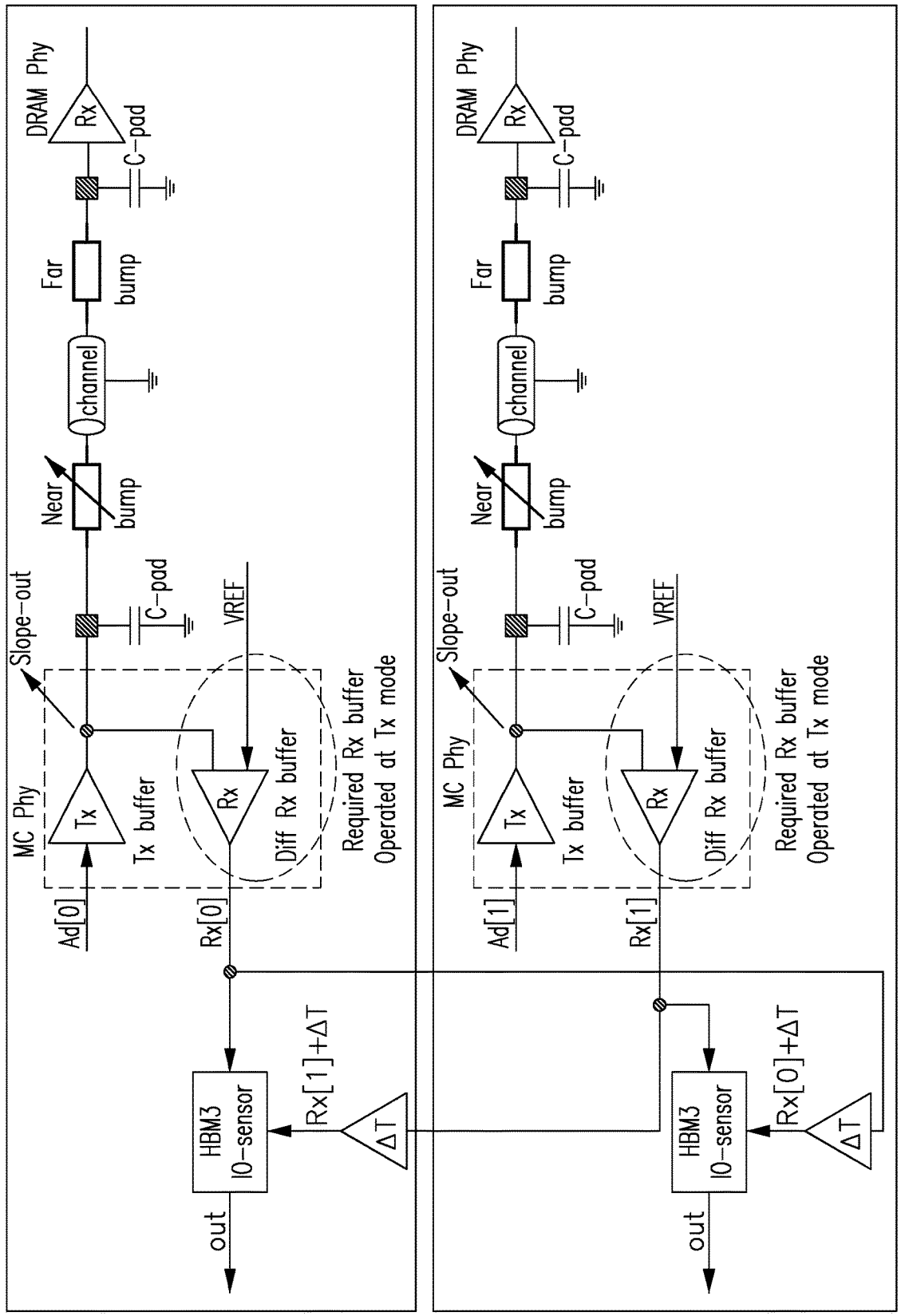
FIG. 11 shows a schematic circuit diagram of an implementation of an I/O sensor for the monitoring of degradation of transmit-only signal interconnect channels.

With reference to FIG. 11, there is shown a schematic circuit diagram of an implementation of an I/O sensor in accordance with the disclosure for the monitoring of degradation of transmit only signal interconnect channels (lanes), which is also particularly suited to HBM3 3D IC packages. Common features with those of FIG. 10 will not be described again for the sake of conciseness. Two signal interconnect channels are shown, each having a respective I/O sensor provided with an output of the respective NE Differential Receive Buffer for the channel as a data input. In this mode of operation, there is no reference signal such as a clock signal that can be used as comparison for measuring setup or hold time. Thus, the output of the NE Differential Receive Buffer for the other channel is provided as a clock input to the respective I/O sensor. This means that each I/O sensor measures a setup or hold time between signals from adjacent pins or lanes. In other words, each pin is used as a reference signal for an adjacent pin.

For example, a reference for a first lane receiver output (Rx[0]) is a delayed version of a second lane receiver output (Rx[1]). The delay is given by $\Delta T$. In this case, the data signal for the first lane I/O sensor is Rx[0] and the clock signal is Rx[1]+$\Delta T$. The setup time is measured by the I/O sensor as the time difference (delta) between Rx[1]+ΔT to Rx[0]. A degradation in one of the signals (Rx[0] or Rx[1]) will cause a setup time change that will be detected by the sensor. This is therefore sensitive to a change in transmission buffer strength and to NE bump resistance change. ΔT is set such that at least one of the following conditions will hold, considering the Rx[0] to Rx[1] total skew: I/O sensor intrinsic delay (IO_Sensor$_{int\_Delay}$)≤Setup_time[0]≤IO sensor max setup window; and I/O sensor intrinsic delay-≤Setup_time[1]≤I/O sensor max setup window.

Figure 12A:
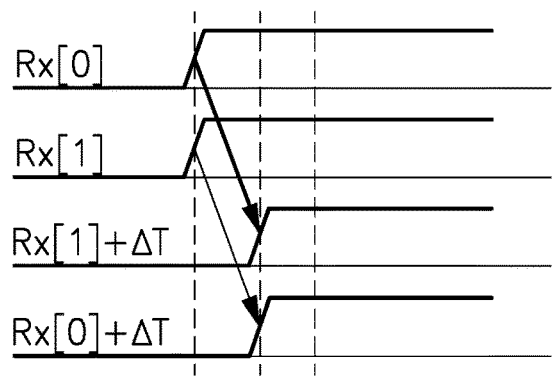
FIGS. 12A, 12B, and 12C show waveform timings for three scenarios, respectively, in the degradation monitoring of transmit-only signal interconnect channels.
Figure 12B:
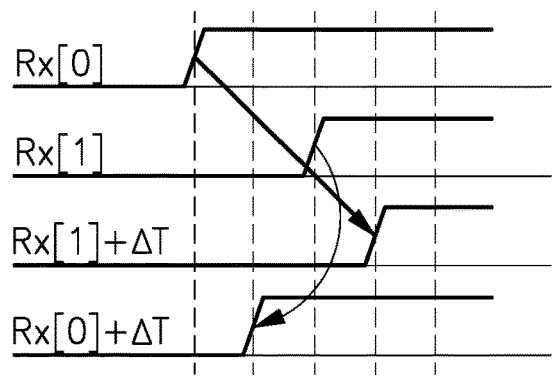
Figure 12C:
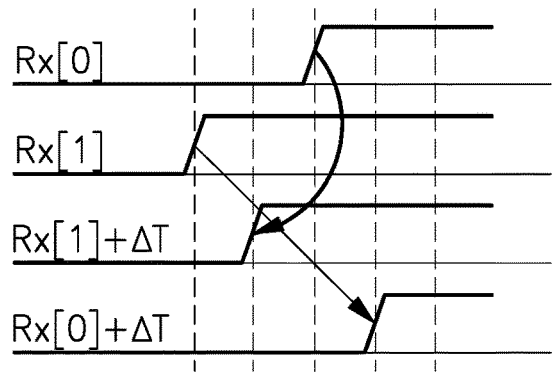

With reference to FIG. 12, there are depicted waveform timings for three scenarios in the degradation monitoring of transmit only signal interconnect channels. In each case, ΔT is set as 1.5×IO_Sensor$_{int\_Delay}$. The initial timing relation is determined by random variation of the receivers and by the data alignment (D[0] to D[1]). The timing scenarios are used to determine ΔT for proper operation under timing skew from the first lane to the second lane. In the first scenario (a), the timing for the first lane is the same as for the second lane (that is, Rx[0]=Rx[1]), in the second scenario (b), the timing for the first lane is the before the second lane (for example, Rx[0]−Rx[1]≥−20 ps) and in the third scenario (c), the timing for the first lane is after the second lane (that is, Rx[0]−Rx[1]≤20 ps).

Figure 13:
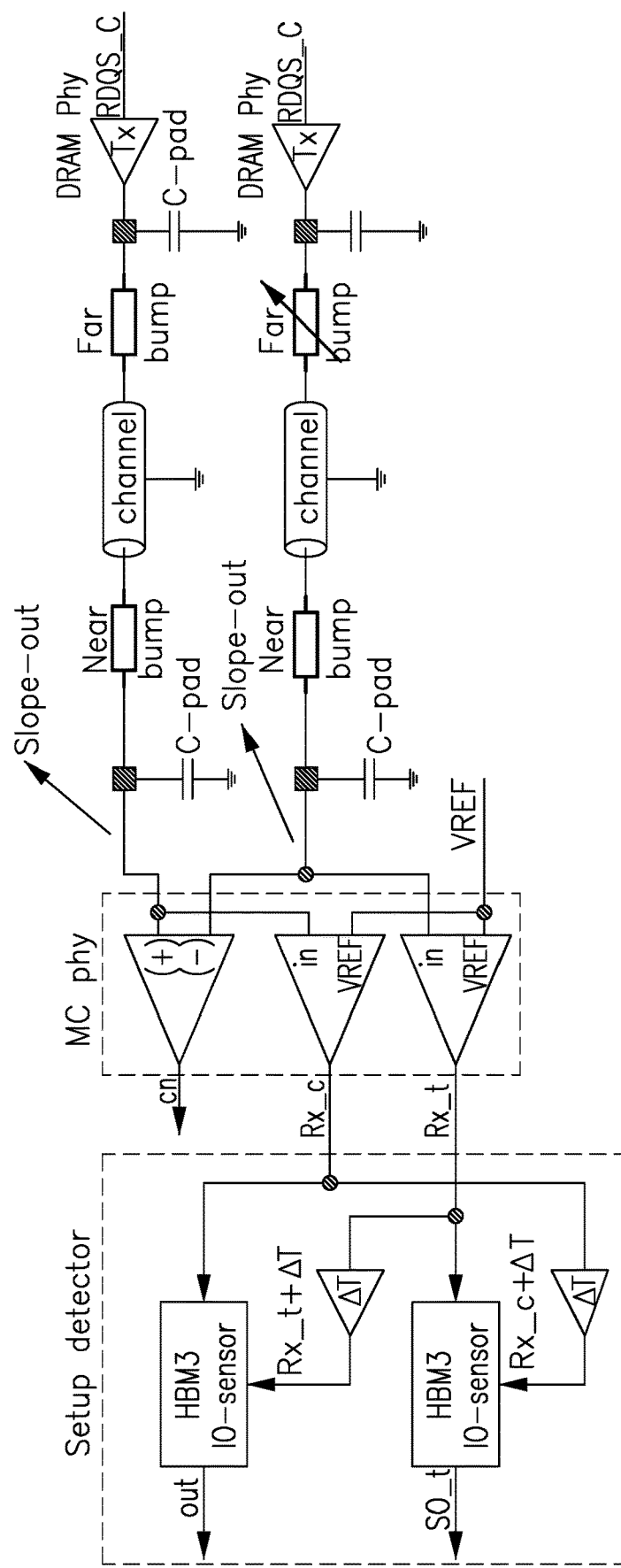
FIG. 13 shows a schematic circuit diagram of an implementation of an I/O sensor for the monitoring of degradation of differential interconnect receive channels.

With reference to FIG. 13, there is shown a schematic circuit diagram of an implementation of an I/O sensor in accordance with the disclosure for the monitoring of degradation of differential interconnect receive channels (lanes), which is also particularly suited to HBM3 3D IC packages. Common features with those of FIGS. 10 and 11 will not be described again for the sake of conciseness. As for the case of transmit only lanes, there is no reference signal such as a clock, so two single-ended signals Rx_c & Rx_t are used as a reference to one each other after being delayed by ΔT (in the same way as for the transmit-only case). The first single-ended signal Rx_c is generated by comparing the signal received from one side of the differential channel with a threshold voltage (VREF) and the second single-ended signal Rx_t is generated by comparing the signal received from the other side of the differential channel with the threshold voltage (VREF). A degradation in one of the signals will be detected by the I/O sensor (under the assumption that degradation does not happen for both signals at the same time). This can be used for continuous measurement of clock or strobes symmetry (Rx_c-rise to Rx_t-rise).

Figure 14:
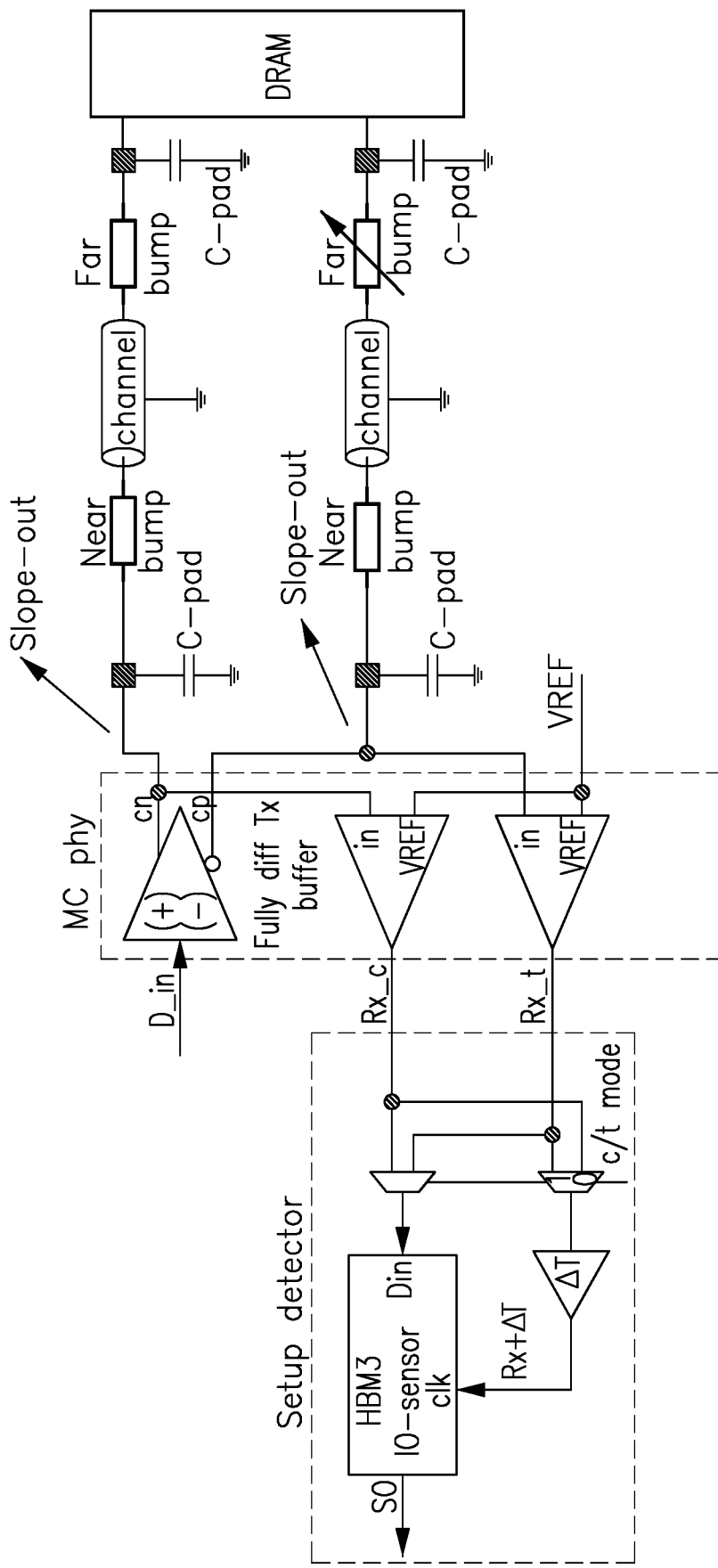
FIG. 14 shows a schematic circuit diagram of an implementation of an I/O sensor for the monitoring of degradation of differential interconnect transmit channels.

With reference to FIG. 14, there is shown a schematic circuit diagram of an implementation of an I/O sensor in accordance with the disclosure for the monitoring of degradation of differential interconnect transmit channels (lanes), which is also particularly suited to HBM3 3D IC packages. This shows a transmit strobe, using a differential transmit buffer, which receives a data input (D_in) and provides differential transmission outputs (cn, cp). The differential transmission outputs are each provided to respective (pseudo) differential receive buffers (which as previously noted, could be implemented with alternative types of receive buffer), which each provide a data output (Rx_c, Rx_t). The drawing also shows how a single I/O sensor and a multiplexing arrangement for the Rx_c and Rx_t signals can be used instead of two I/O sensors. This can also be employed for the monitoring of degradation of differential interconnect receive channels, instead of the arrangement in FIG. 13 or the monitoring of degradation of multiple transmit only signal interconnect channels (lanes) instead of the arrangement shown in FIG. 11.

Returning to the generalized sense discussed above, there may be considered an I/O block for a semiconductor IC (and this may be combined with any other aspect disclosed herein). The I/O block comprises: a receive buffer, configured to receive a voltage signal from an interconnected part of the semiconductor IC and to provide a receive buffer output; and an I/O sensor as herein disclosed. The receive buffer output (which may indicate a logical level) may be provided as the data signal input to the delay circuitry of the I/O sensor. The receive buffer may be a differential (or pseudo differential) receive buffer and may be further configured to compare the received voltage signal with a voltage threshold input and to provide a receive buffer output based on the comparison.

The I/O sensor is beneficially further configured to receive a clock signal input (which may be used in various ways, as discussed elsewhere herein). In some embodiments, a clock signal associated with the received voltage signal may be provided as the clock signal input. This may be used for measurement and/or monitoring of bidirectional or receive only pins or lanes.

In some implementations, the (differential) receive buffer is a first (differential) receive buffer and is configured to receive a first voltage signal from a first interconnected part of the semiconductor IC and provide a first receive buffer output. Then, the I/O block may further comprise: a second (differential) receive buffer, configured to receive a second voltage signal from a second interconnected part of the semiconductor IC, optionally to compare the received second voltage signal with the voltage threshold input and to provide a second receive buffer output, where appropriate based on the comparison. In this case, the second receive buffer output with a (fixed or adjustable) delay applied may be provided as the clock signal input. This may be used for measurement and/or monitoring of transmit only or differential pins or lanes. For example, the first and second interconnected parts of the semiconductor IC may form a differential channel (although in other embodiments, they may simply be physically and/or logically adjacent).

In certain embodiments, the I/O sensor is a first I/O sensor and the clock signal input is a first clock signal input. Then, the I/O block may further comprise: a second I/O sensor as disclosed herein, wherein the second receive buffer output is provided as the data signal input to the delay circuitry. The second I/O sensor may be further configured to receive a second clock signal input. Then, the first receive buffer output with a (fixed or adjustable) delay applied may be provided as the second clock signal input.

In other embodiments, a single I/O sensor may be used to measure the margin. Then, the I/O block may further comprise: a multiplexing arrangement, configured to selectively apply: (a) the first receive buffer output as the data signal input to the I/O sensor and the second receive buffer output with a delay applied as the clock signal input to the I/O sensor; or (b) the second receive buffer output as the data signal input to the I/O sensor and the first receive buffer output with a delay applied as the clock signal input to the I/O sensor.

Optionally, the mechanism for holding the output of the fifth state-element (FF5), indicating a sensor fail indication signal (ptrn_io_sensor_fail), may be masked. This option can be used to avoid locking the sensor fail indication signal in situations where the data and/or the clock are not stable (a time interval for instability may be defined by a protocol). This can be performed by adding a control signal to enable the sampling by the fifth state-element (FF5), for example controlling the reset or the data input of the fifth state-element (FF5).

In a general sense, provided here is an I/O sensor, or a die-to-die connectivity monitoring system, which physically resides in (embedded in) one IC of a multi-IC module; or multiple such sensors/systems may physically reside in multiple ICs of a multi-IC module, one per each IC or even multiple ones per each IC. Such sensor/system may be beneficial for any interconnected part of any IC in a multi-IC module.

Throughout this disclosure, various embodiments may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

In the description and claims of the disclosure, each of the words "comprise" "include" and "have", and forms thereof, are not necessarily limited to members in a list with which the words may be associated. In addition, where there are inconsistencies between this application and any document incorporated by reference, it is hereby intended that the present application controls.

To clarify the references in this disclosure, it is noted that the use of nouns as common nouns, proper nouns, named nouns, and the/or like is not intended to imply that embodiments of the invention are limited to a single embodiment, and many configurations of the disclosed components can be used to describe some embodiments of the invention, while other configurations may be derived from these embodiments in different configurations.

In the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming but would nevertheless be a routine undertaking of engineering for those of ordinary skill in the art having the benefit of this disclosure.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Moreover, the various features and embodiments of the invention described above are specifically contemplated to be used alone as well as in various combinations.

Conventional and/or contemporary circuit design and layout tools may be used to implement the invention. The specific embodiments described herein, and in particular the various circuit arrangements, measurements and data flows, are illustrative of exemplary embodiments, and should not be viewed as limiting the invention to such specific implementation choices. Accordingly, plural instances may be provided for components described herein as a single instance. The determination of margin and/or other parameters may be made in different parts of the configuration, for example. Other types of eye parameter than eye width may be determined using the margin measurements. Indeed, an eye parameter need not be calculated at all in some cases. Optionally, the IO-sensor can be expanded to measure simultaneously the two sides of the data eye, by implementing a second delay line on the clock signal.

While circuits and physical structures are generally presumed, it is well recognized that in modern semiconductor design and fabrication, physical structures and circuits may be embodied in computer readable descriptive form suitable for use in subsequent design, test or fabrication stages as well as in resultant fabricated semiconductor integrated circuits. Accordingly, claims directed to traditional circuits or structures may, consistent with particular language thereof, read upon computer readable encodings (which may be termed programs) and representations of same, whether embodied in media or combined with suitable reader facilities to allow fabrication, test, or design refinement of the corresponding circuits and/or structures. Structures and functionality presented as discrete components in the exemplary configurations may be implemented as a combined structure or component. The invention is contemplated to include circuits, systems of circuits, related methods, and computer-readable (medium) encodings of such circuits, systems, and methods, all as described herein, and as defined in the appended claims. As used herein, a computer readable medium includes at least disk, tape, or other magnetic, optical, or semiconductor (e.g., flash memory cards, ROM) medium that is non-transitory.

The foregoing detailed description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, which are intended to define the scope of this invention. In particular, even though the main embodiments are described in the context of a 3D IC, the teachings of the present invention are believed advantageous for use with other types of semiconductor IC using I/O circuitry. Moreover, the techniques described herein may also be applied to other types of circuit applications. Accordingly, other variations, modifications, additions, and improvements may fall within the scope of the invention as defined in the claims that follow.

Embodiments of the present invention may be used to fabricate, produce, and/or assemble integrated circuits and/or products based on integrated circuits.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A multi-IC (Integrated Circuit) module comprising:
   a first IC comprising a transmitter; and
   a second IC interconnected to said first IC over an interconnect lane, wherein said second IC comprises:
      a receiver,
      an adjustable delay line configured to receive, from said receiver, a data signal that was transmitted by said transmitter of said first IC over the interconnect lane, and
      processing logic configured to:
         set said adjustable delay line to a plurality of time durations, to delay the data signal until a fail condition is detected, and
         based on the detection of the fail condition, determine reliability of connectivity between the first and second ICs.

2. The multi-IC module of claim 1, wherein said processing logic is further configured, in response to the determined reliability of connectivity, to repair the interconnect lane.

3. The multi-IC module of claim 1, wherein said processing logic is further configured, in response to the determined reliability of connectivity, to adjust at least one of data throughput and clock rate of the multi-IC module.

4. The multi-IC module of claim 1, wherein said first and second ICs are interconnected at least using one or more of:
   (a) bumps;
   (b) micro-bumps;
   (c) pins;
   (d) a Re-Distribution Layer (RDL) and Through Integrated Fan-Out Vias (TIVs);
   (e) Through-Silicon Vias (TSVs); or
   (f) pads.

5. The multi-IC module of claim 4, wherein the determination of the reliability of connectivity comprises determining a resistance parameter of at least one of (a) through (f).

6. The multi-IC module of claim 4, wherein the reliability of connectivity is affected by degradation of at least one of (a) through (f).

7. The multi-IC module of claim 1, wherein the determination of the reliability of connectivity comprises determining a systematic effect parameter.

8. The multi-IC module of claim 1, wherein the determination of the reliability of connectivity comprises determining a parameter indicating a symmetry of differential signals.

9. The multi-IC module of claim 1, wherein the determination of the reliability of connectivity comprises determining clock duty cycle effects on eye width.

10. The multi-IC module of claim 1, wherein the reliability of connectivity is affected by an open circuit.

11. The multi-IC module of claim 1, wherein the reliability of connectivity is affected by a short circuit.

12. The multi-IC module of claim 1, wherein the reliability of connectivity is affected by a bridge short.

13. The multi-IC module of claim 1, wherein said processing logic is further configured to measure a margin, based on a minimum delay that caused the fail condition.

14. The multi-IC module of claim 1, wherein said processing logic is further configured to determine a sum of minimum time durations which caused the fail condition.

15. The multi-IC module of claim 1, wherein said processing logic is further configured, based on the detection of the fail condition, to measure a margin of the data signal.

16. The multi-IC module of claim 15, wherein the margin measurement comprises at least one of:
   a data signal setup time to clock rising edge;
   a data signal setup time to clock falling edge;
   a data signal hold time to clock rising edge; and
   a data signal hold time to clock falling edge.

17. The multi-IC module of claim 1, wherein said delay circuitry comprises:
   a first state-element, configured to receive a first state-element input signal and to provide a first state-element output based on the first state-element input signal and a first clock input;
   a second state-element, configured to receive a second state-element input signal and to provide a second state-element output based on the second state-element input signal and a second clock input; and
   a multiplexing arrangement, configured selectively to apply one of:
      the data signal as the input signal to the adjustable delay line, an output of the adjustable delay-line being provided as the first state-element input signal, the data signal being provided as the second state-element input signal, and a clock signal being provided as the first and second clock inputs; and
      the clock signal as the input signal to the adjustable delay line, an output of the adjustable delay-line being provided as the first clock input, the data signal being provided as the first and second state-element input signals, and the clock signal being provided as the second clock input.

18. The multi-IC module of claim 17, wherein said multiplexing arrangement is further configured to selectively apply, as the clock signal:
   a positive clock signal; or
   a negative clock signal that is the positive clock signal inverted.

* * * * *

UNITED STATES PATENT AND TRADEMARK OFFICE
CERTIFICATE OF CORRECTION

PATENT NO. : 12,072,376 B2
APPLICATION NO. : 17/712698
DATED : August 27, 2024
INVENTOR(S) : Eyal Fayneh et al.

Page 1 of 1

It is certified that error appears in the above-identified patent and that said Letters Patent is hereby corrected as shown below:

In the Specification

Column 12, Line 60, change "setup" to --hold--.

Signed and Sealed this
Twenty-fourth Day of December, 2024

Derrick Brent
*Acting Director of the United States Patent and Trademark Office*